United States Patent
Matsushita et al.

(10) Patent No.: US 7,518,292 B2
(45) Date of Patent: Apr. 14, 2009

(54) PIEZOELECTRIC SINGLE CRYSTAL AND PIEZOELECTRIC SINGLE-CRYSTAL DEVICE AND METHOD FOR MANUFACTURING THE SAME

(75) Inventors: Mitsuyoshi Matsushita, Chiba (JP); Yosuke Iwasaki, Chiba (JP)

(73) Assignee: JFE Mineral Company, Ltd., Tokyo (JP)

( * ) Notice: Subject to any disclaimer, the term of this patent is extended or adjusted under 35 U.S.C. 154(b) by 0 days.

(21) Appl. No.: 10/575,955

(22) PCT Filed: Oct. 14, 2004

(86) PCT No.: PCT/JP2004/015558

§ 371 (c)(1),
(2), (4) Date: Mar. 6, 2007

(87) PCT Pub. No.: WO2005/035840

PCT Pub. Date: Apr. 21, 2005

(65) Prior Publication Data

US 2007/0267947 A1  Nov. 22, 2007

(30) Foreign Application Priority Data

Oct. 14, 2003 (JP) .............................. 2003-353687

(51) Int. Cl.
*H01L 41/187* (2006.01)

(52) U.S. Cl. ............................... 310/358; 252/62.9 PZ; 501/134

(58) Field of Classification Search .................. 310/358; 252/62.9 P, 62.9 PZ; 501/134
See application file for complete search history.

(56) References Cited

U.S. PATENT DOCUMENTS

| | | | | |
|---|---|---|---|---|
| 4,710,479 | A | * | 12/1987 | Yamanaka et al. ............. 501/15 |
| 5,275,988 | A | * | 1/1994 | Mori et al. ................... 501/136 |
| 5,861,350 | A | * | 1/1999 | Mori et al. ................... 501/136 |
| 6,207,069 | B1 | * | 3/2001 | Furukawa et al. ...... 252/62.9 PZ |
| 2004/0087432 | A1 | * | 5/2004 | Sasaki ......................... 501/134 |
| 2006/0019818 | A1 | * | 1/2006 | Baba-Kishi-Zadeh et al. .... 501/134 |

* cited by examiner

*Primary Examiner*—Thomas M Dougherty
(74) *Attorney, Agent, or Firm*—Oliff & Berridge, PLC

(57) ABSTRACT

An inexpensive piezoelectric single-crystal device being excellent in the piezoelectric characteristics and having a complex perovskite structure can be provided by adding a specific additive to a lead magnesium niobate-lead titanate (PMN-PT) single crystal or a lead zinc niobate-lead titanate (PZN-PT or PZNT) single crystal. Specifically, the piezoelectric single crystal has a complex perovskite structure and is formed of a composition containing 35 to 98 mol % lead magnesium niobate [$Pb(Mg_{1/3}Nb_{2/3})O_3$] or lead zinc niobate [$Pb(Zn_{1/3}Nb_{2/3})O_3$], 0.1 to 64.9 mol % lead titanate [$PbTiO_3$], and 0.05 to 30 mol % lead indium niobate [$Pb(In_{1/2}Nb_{1/2})O_3$] wherein calcium is substituted for 0.05 to 10 mol % lead in the composition.

9 Claims, 6 Drawing Sheets

○ : OXYGEN ION
● : M ION
◉ : R ION

PIEZOELECTRIC SINGLE CRYSTAL AND PIEZOELECTRIC SINGLE-CRYSTAL DEVICE AND METHOD FOR MANUFACTURING THE SAME

TECHNICAL FIELD

The present invention relates to piezoelectric single crystals and piezoelectric single-crystal devices and methods for manufacturing the same, and further relates to 1-3 piezoelectric composites as shown in FIG. 1.

In particular, the present invention is a technology relating to an improvement in yield of piezoelectric single-crystal devices [for example, products formed of a lead magnesium niobate-lead titanate ($Pb(Mg_{1/3}Nb_{2/3})O_3$—$PbTiO_3$: PMN-PT) single crystal or a lead zinc niobate-lead titanate ($Pb(Zn_{1/3}Nb_{2/3})O_3$—$PbTiO_3$: PZN-PT or PZNT) single crystal] of which piezoelectric characteristics such as an electromechanical coupling factor ($k_{31}$, $k_{33}$) and a piezoelectric constant ($d_{31}$, $d_{33}$) are significantly improved compared with those of conventional sintered piezoelectric devices [for example, lead zirconium titanate ($Pb(Zr, Ti)O_3$: PZT)].

BACKGROUND ART

When a piezoelectric single-crystal device is a rectangular parallelepiped, for example, as shown in FIG. 2 and the longitudinal direction is the polarization direction 3 (hereinafter the polarization direction is referred to as PD), the magnitude of vibration in the polarization direction PD (vibration in the longitudinal direction) when a voltage is applied in the polarization direction PD is represented by an electromechanical coupling factor $k_{33}$ in a longitudinal vibration mode that is proportional to the square root of the conversion efficiency of the electric energy and the mechanical energy. The greater $k_{33}$ value is, the more the conversion efficiency improves. When the piezoelectric single-crystal device is plate-shaped, for example, as shown in FIG. 3, the conversion efficiency increases with an electromechanical coupling factor $k_{31}$ in the direction 1 (lateral vibration mode) orthogonal to the polarization direction PD. The shape of the piezoelectric single-crystal device may be a bar, a square plate, or a circular plate, in addition to the above-mentioned rectangular parallelepiped and plate-shape, and the electromechanical coupling factor can be similarly determined for each differently shaped device.

With respect to the piezoelectric single-crystal device, Japanese Unexamined Patent Application Publication No. 6-38963 discloses an ultrasonic wave probe using a piezoelectric device formed of a solid solution single crystal of lead zinc niobate-lead titanate (PZN-PT), for example. It is described that the electromechanical coupling factor ($k_{33}$) in the polarization direction of such a piezoelectric single-crystal device is 80 to 85% which is sufficiently large to obtain a probe with excellent sensitivity.

However, an ingot and a wafer (substrate) formed of a piezoelectric single crystal of lead zinc niobate-lead titanate (PZN-PT) is expensive compared with those formed of lead zirconium titanate ($Pb(Zr, Ti)O_3$: PZT) which is a conventional piezoelectric device material. Additionally, a piezoelectric single crystal formed of lead magnesium niobate-lead titanate (PMN-PT) using lead magnesium niobate (PMN) instead of lead zinc niobate (PZN) and other piezoelectric single crystals having a similar composition are also expensive.

The causes that the ingots and wafers formed of such piezoelectric single crystals are expensive are thought to be the following:

A first cause is evaporation of lead oxide (PbO) during the single-crystal growth. In the Melt Bridgman method, a single crystal is grown by melting a powder, calcined material, or sintered compact of raw material components for forming the piezoelectric single crystal and solidifying it in one direction. In the Solution Bridgman method, a single crystal is grown by dissolving the raw material components for forming the piezoelectric single crystal in a solution by using a flux and solidifying it in one direction. In single crystal growth by the Melt Bridgman method or the Solution Bridgman method, since the vapor pressure of lead oxide (PbO) existing as a component or the flux becomes high at a temperature used for the single crystal growth, the lead oxide significantly evaporates. Consequently, during the solidification process, a pyrochlore phase which deviates from a desired composition ratio and has a poor piezoelectric characteristic is precipitated or a large number of microcrystals having irregular crystal orientations are precipitated on the pyrochlore phase. Therefore, a crystal yield and a wafer yield are significantly reduced. Here, the term "crystal yield" means percentage (%) of mass of a complete single-crystal portion not having the pyrochlore phase and any heat cracks to the total mass of the fed raw material. The term "wafer yield" means percentage (%) of the number of complete wafers not having the pyrochlore phase and any heat cracks to the total number of the wafers prepared by cutting the resulting single-crystal portion so as to have a desired orientation and a desired thickness with a cutting tool such as a wire saw.

A second cause is the occurrence of cracks during the single-crystal growth. When the single crystal is grown by the Melt Bridgman method or the Solution Bridgman method, a temperature difference is generated in the growth direction of the crystal in a crucible and a temperature difference is generated between the central portion of the single crystal and the external surface of the single crystal being in contact with the inner wall of the crucible in a cooling process to a room temperature during and after the growth of the single crystal. Cracking of the single crystal (heat cracking) tends to occur during the growth process and the cooling process due to thermal strain caused by these temperature differences. Therefore, the crystal yield and the wafer yield are significantly decreased. Additionally, there is a tendency that the cracking occurs more readily in a single crystal having better crystallinity.

A third cause is the occurrence of chipping during the manufacturing of a piezoelectric single-crystal device. After the single crystal growth by the Melt Bridgman method or the Solution Bridgman method, an ingot of the resulting piezoelectric single crystal is cut into wafers and single-crystal plates having a desired piezoelectric device shape. During the cutting process, fine chipping occurs at the peripheries of the cut end faces of the single-crystal plate. Therefore, the single-crystal plate yield of the piezoelectric single-crystal device is significantly decreased. Here, the term "single-crystal plate yield" means the percentage (%) of the number of complete single-crystal plates not having chipping to the total number of the single-crystal plates having a desired size obtained by cutting the resulting wafer with a cutting tool such as a dicing saw.

Thus, when the piezoelectric single-crystal plate and the piezoelectric single-crystal device are manufactured by growing the piezoelectric single crystal using a powder, calcined material, or sintered compact of the raw material components for forming the piezoelectric single crystal, the decreases in the crystal yield and the wafer yield of the piezoelectric single-crystal device, and the single-crystal plate yield cannot be avoided and consequently the production cost is increased. As a result, there have been negative effects such as the number of fields in which they can be applied is limited.

DISCLOSURE OF INVENTION

An object of the present invention is to provide a piezoelectric single crystal suitable for manufacturing an inexpensive piezoelectric single-crystal device having excellent piezoelectric characteristics such as an electromechanical coupling factor ($k_{31}$, $k_{33}$) and a piezoelectric constant ($d_{31}$, $d_{33}$), and to provide a piezoelectric single-crystal device using the same and a method for manufacturing such a piezoelectric single-crystal device. The piezoelectric single crystal can be produced by adding a particular additive to a lead magnesium niobate-lead titanate (PMN-PT) single crystal or a lead zinc niobate-lead titanate (PZN-PT or PZNT) single crystal.

Another object of the present invention is to provide a 1-3 piezoelectric composite formed by a plurality of the piezoelectric single-crystal devices.

The piezoelectric single crystal of the present invention has a complex perovskite structure and is formed of a composition containing 35 to 98 mol % lead magnesium niobate [$Pb(Mg_{1/3}Nb_{2/3})O_3$] or lead zinc niobate [$Pb(Zn_{1/3}Nb_{2/3})O_3$], 0.1 to 65 mol % lead titanate [$PbTiO_3$], and 0.05 to 30 mol % lead indium niobate [$Pb(In_{1/2}Nb_{1/2})O_3$]. Furthermore, 0.05 to 10 mol % lead in the composition is replaced with calcium.

The piezoelectric single crystal of the present invention further contains up to 5 mol % in total of at least one element selected from the group consisting of Mn, Cr, Sb, W, Al, La, Li, and Ta, in addition to the above-mentioned composition.

A piezoelectric single-crystal device of the present invention has a polarization direction in the [001] direction of an ingot of the above-mentioned piezoelectric single crystal, and uses an electromechanical coupling factor ($k_{31}$) in a lateral vibration mode. In the lateral vibration mode, the end face perpendicularly cuts a (001) plane containing the [100] direction and the [010] direction being approximately orthogonal to the polarization direction. When the [100] direction or the [010] direction is defined as 0°, the piezoelectric single-crystal device has the direction normal to the end face within 0°±15° (in other words, within a solid angle of the [100] axis ±15° or the axis ±15°) or within 45°±5° (in other words, within a solid angle of the [110] axis ±5°).

A piezoelectric single-crystal device of the present invention has a polarization direction in the [001] direction of an ingot of the above-mentioned piezoelectric single crystal, and uses an electromechanical coupling factor ($k_{33}$) in a vibration mode in the direction parallel to the polarization direction, i.e., in a longitudinal vibration mode. In the longitudinal vibration mode, the end face is in a (001) plane. When the shortest-side length or the diameter of the device end face which is orthogonal to the polarization direction is defined as a and the device length in the direction parallel to the polarization direction is defined as b, the piezoelectric single-crystal device has the a and the b satisfying the relational formula b/a≧2.5.

A piezoelectric single-crystal device of the present invention has a polarization direction in the [110] direction of an ingot of the above-mentioned piezoelectric single crystal, and uses an electromechanical coupling factor ($k_{33}$) in a vibration mode in the direction parallel to the polarization direction, i.e., in a longitudinal vibration mode. In the longitudinal vibration mode, the end face is in a (110) plane. When the shortest-side length or the diameter of the device end face which is orthogonal to the polarization direction is defined as a and the device length in the direction parallel to the polarization direction is defined as b, the piezoelectric single-crystal device has the a and the b satisfying the relational formula b/a≧2.5.

A 1-3 piezoelectric composite of the present invention is formed by arraying a plurality of the above-mentioned piezoelectric single-crystal devices so that their end faces, which are orthogonal to the polarization direction, reside in one plane.

A method for manufacturing the above-mentioned piezoelectric single-crystal device according to the present invention includes the steps of cutting the piezoelectric single-crystal ingot into single-crystal device materials having a predetermined shape in a predetermined direction; and polarizing each single-crystal device material by applying a direct electric field of 350 to 1500 V/mm along a direction to be polarized of the single-crystal device material in the temperature range of 20 to 200° C. or applying a direct electric field of 350 to 1500 V/mm at a temperature higher than the Curie temperature (Tc) of the single-crystal device material and then cooling it to a room temperature while applying the direct electric field.

A method for manufacturing the above-mentioned piezoelectric single-crystal device according to the present invention includes the steps of polarizing the piezoelectric single-crystal ingot by applying a direct electric field of 350 to 1500 V/mm along a direction to be polarized of the piezoelectric single-crystal ingot in the temperature range of 20 to 200° C. or applying a direct electric field of 350 to 1500 V/mm at a temperature higher than the Curie temperature (Tc) of the single-crystal device material and then cooling it to a room temperature while applying the direct electric field; and cutting the piezoelectric single-crystal ingot into single-crystal device materials having a predetermined shape in a predetermined direction.

In a method for manufacturing a 1-3 piezoelectric composite according to the present invention, a plurality of the above-mentioned piezoelectric single-crystal devices manufactured in the above-mentioned method are arrayed so that their end faces, which are orthogonal to the polarization direction, reside in one plane.

REFERENCE NUMERALS

Figure 1:
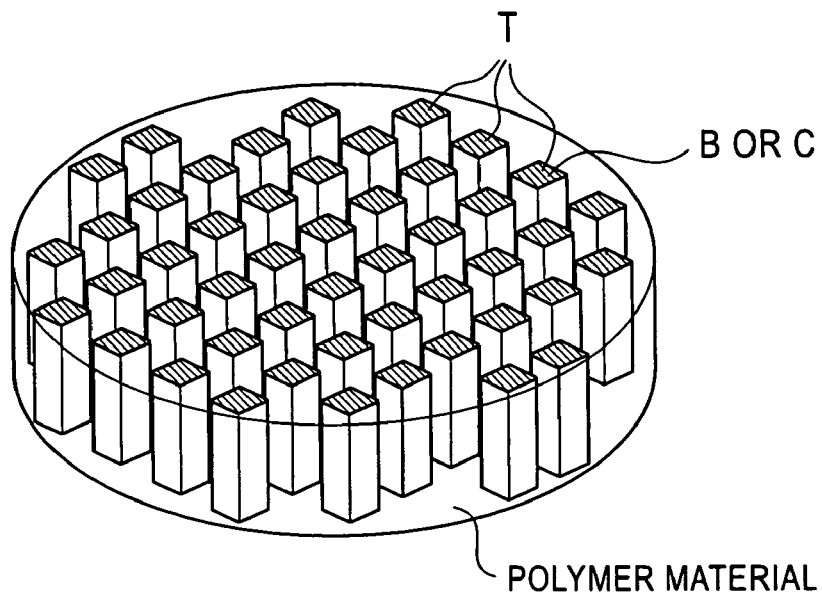
FIG. 1 is a diagram illustrating a 1-3 piezoelectric composite.

A: plate-shaped piezoelectric single-crystal device using the electromechanical coupling factor ($k_{31}$) in a lateral vibration mode;

B, C: rectangular parallelepiped piezoelectric single-crystal device using the electromechanical coupling factor ($k_{33}$) in a polarization direction (longitudinal vibration mode);

T: end face of a cut-out single crystal device material;

a: size in the lateral direction of a single-crystal device;

c: size (in depth (direction 2)) of the end face of a single-crystal device;

b: size in the longitudinal direction (thickness direction) of a single-crystal device;

c': convex end face of a single-crystal device;

c'': concave end face of a single-crystal device;

V: direct-current voltage;

1: direction (lateral vibration direction) normal to the end face T of a device using the electromechanical coupling factor ($k_{31}$) in a lateral vibration mode;

2: depth direction of a device end face T; and

PD or 3: polarization direction (longitudinal vibration direction)

BEST MODE FOR CARRYING OUT THE INVENTION

In order to provide a piezoelectric single-crystal device which can be applied to various fields at a reasonable cost instead of the conventional high cost, the present inventors have intensively studied a method for maintaining excellent piezoelectric characteristics of the piezoelectric single-crystal device while suppressing a decrease in the yield due to the above-mentioned causes. As a result, the inventors have found that such a piezoelectric single-crystal device can be accomplished by using a piezoelectric single crystal the composition of which is adjusted by adding specific additives. Specifically, both of lead indium niobate and calcium are added to the piezoelectric single crystal.

The present invention will now be described in detail.

The composition of the piezoelectric single crystal of the present invention contains 35 to 98 mol % lead magnesium niobate or lead zinc niobate, 0.1 to 64.9 mol % lead titanate, and 0.1 to 30 mol % lead indium niobate [Pb(In$_{1/2}$Nb$_{1/2}$)O$_3$]. Furthermore, calcium is substituted for 0.05 to 10 mol % lead in the composition.

Grounds for the limitation in the ranges of the content of lead magnesium niobate or lead zinc niobate, the content of lead titanate, and the content of lead indium niobate and grounds for the substitution of calcium in the composition are as follows:

(1) 35 to 98 mol % Lead Magnesium Niobate [Pb(Mg$_{1/3}$Nb$_{2/3}$)O$_3$: PMN] or Lead Zinc Niobate [Pb(Zn$_{1/3}$Nb$_{2/3}$)O$_3$: PZN]:

Lead magnesium niobate or lead zinc niobate is the main component of the single crystal of the present invention. When the content is less than 35 mol %, the grown single-crystal cannot exhibit desired piezoelectric characteristics (such as the k value and d value). When the content is higher than 98 mol %, a single crystal having a size suitable for practical use cannot be grown.

In addition, the optimum range of the lead magnesium niobate content is 50 to 98 mol % and the optimum range of the lead zinc niobate content is 80 to 98 mol %. Furthermore, the molecular ratio of Mg to Nb, Mg/Nb, in the lead magnesium niobate [Pb(Mg$_{1/3}$Nb$_{2/3}$)O$_3$] is defined as 0.5, but it is not limited to this. The range of 0.45 to 0.54 of the molecular ratio of Mg to Nb is included in the scope of the present invention. Therefore, the lead magnesium niobate may be expressed by Pb(Mg, Nb)O$_3$. Similarly, the molecular ratio of Zn to Nb, Zn/Nb, in the lead zinc niobate [Pb(Zn$_{1/3}$Nb$_{2/3}$)O$_3$] is defined as 0.5, but it is not limited to this. The range of 0.45 to 0.54 of the molecular ratio of Zn to Nb is included in the scope of the present invention. Therefore, the lead zinc niobate may be expressed by Pb(Zn, Nb)O$_3$.

Additionally, as the composition containing 35 to 98 mol % lead magnesium niobate or lead zinc niobate; 0.1 to 64.9 mol % lead titanate, lead magnesium niobate-lead titanate (a representative example: [Pb(Mg$_{1/3}$Nb$_{2/3}$)O$_3$]$_{0.68}$[PbTiO$_3$]$_{0.32}$ (PMN68-PT32)) and lead zinc niobate-lead titanate (a representative example: [Pb(Zn$_{1/3}$Nb$_{2/3}$)O$_3$]$_{0.91}$[PbTiO$_3$]$_{0.09}$ (PZN91-PT9)) are well known.

(2) 0.05 to 30 mol % Lead Indium Niobate [Pb(In$_{1/2}$Nb$_{1/2}$)O$_3$]:

The ion radius of indium (In) in lead indium niobate is larger than that of magnesium (Mg) or zinc (Zn) but smaller than that of niobium (Nb). This reduces lattice strain caused by a difference in the ion radius between magnesium (Mg) or zinc (Zn) and niobium (Nb) disposed at the body-centered position of a unit lattice of a perovskite structure and functions to suppress the occurrence of cracking during the single-crystal growth and the occurrence of chipping during the processing of the piezoelectric device. Therefore, in the present invention, it is necessary that the amount of lead indium niobate to be added is 0.05 mol % or more in order to achieve the above-mentioned functions. However, the addition exceeding 30 mol % causes an increase in a melting point of the raw material when the single crystal is grown. This is not preferable because the process control for manufacturing becomes difficult.

Additionally, the molecular ratio of In to Nb, In/Nb, in the lead indium niobate [Pb(In$_{1/2}$Nb$_{1/2}$)O$_3$] is defined as 1, but it is not limited to this. The range of 0.95 to 1.04 of the molecular ratio of In to Nb is included in the scope of the present invention. Therefore, the lead indium niobate may be expressed by Pb(In, Nb)O$_3$.

(3) 0.1 to 64.9 mol % Lead Titanate PbTiO$_3$ (PT):

Since the balance of the above-mentioned 35 to 98 mol % lead magnesium niobate or lead zinc niobate and 0.05 to 30 ml % lead indium niobate is lead titanate, the upper limit of lead titanate is 64.9 mol %. When the content of lead titanate is less than 0.1 mol %, the grown single-crystal cannot exhibit desired piezoelectric characteristics (k value and d value). Therefore, the content should be 0.1 mol % or more.

(4) Substitution of Calcium for 0.05 to 10 mol % Lead in Crystal Lattice:

In order to substitute calcium for 0.05 to 10 mol % lead in the composition (in the crystal lattice) of the single-crystal ingot, the amount of calcium to be added must be determined with consideration of an amount of calcium that evaporates during the single-crystal growth. The addition of calcium may be performed by any method. For example, calcium-substituted lead magnesium niobate, calcium-substituted lead zinc niobate, or calcium-substituted lead titanate may be used. Calcium oxide or calcium carbonate may be added to a raw material. When calcium oxide is added to the raw material, the calcium (Ca) of calcium oxide is disposed as substituted atoms at some lead (Pb) positions (R ions in FIG. 5) of a crystal lattice formed of a solid solution of three types of lead-based perovskite structure compounds (lead magnesium niobate or lead zinc niobate, lead titanate, and lead indium niobate) during the single-crystal growth and inhibits the evaporation of lead oxide at a high temperature. This function of Ca can suppress the generation of a pyrochlore phase. Consequently, a single crystal with a desired complex perovskite phase can be readily generated. In the present invention, in order to achieve the above-mentioned function of Ca, it is necessary to substitute Ca for 0.05 mol % or more of lead. However, the substitution exceeding 10 mol % causes a difficulty in the single-crystal growth. Therefore, preferably, calcium is substituted for 0.05 to 10 mol % of lead in the crystal lattice. More preferably, calcium is substituted for 0.05 to 5 mol % of lead in the crystal lattice.

(5) 5 mol % or Less in Total of at Least One Element Selected from the Group Consisting of Mn, Cr, Sb, W, Al, La, Li, and Ta:

When a relative dielectric constant ∈r or a mechanical quality factor Qm must be high, 5 mol % or less in total of at least one element selected from the group consisting of Mn, Cr, Sb, W, Al, La, Li, and Ta may be added. The addition amount exceeding 5 mol % in total causes a difficulty in obtaining a single crystal. Consequently, a polycrystal may be generated.

Advantageous effects of the addition of these elements are, for example, that the mechanical quality factor Qm can be improved and deterioration over time can be suppressed by adding Mn or Cr. In order to achieve these advantageous effects, one or more elements selected from Mn and Cr is preferably added in a content of 0.05 mol % or more in total. Additionally, the relative dielectric constant can be improved by adding Sb, La, W, or Ta. In order to achieve this advantageous effect, one or more elements selected from the group consisting of Sb, La, W, and Ta is preferably added in a content of 0.05 mol % or more in total. Furthermore, Al and Li contribute to stabilizing the growth of a single crystal. In order to achieve this advantageous effect, one or more elements selected from Al and Li is preferably added in a content of 0.05 mol % or more in total.

(6) Other Impurities

Impurities such as Fe, Pt, Au, Pd, and Rh from the raw material or a crucible may be mixed during the manufacturing process of the piezoelectric single crystal. Since these impurities inhibit the generation of the single crystal, it is desirable that the impurities content is controlled to 0.5 mol % or less in total.

(7) Crystal Structure of Piezoelectric Single Crystal (Complex Perovskite Structure)

Figure 5:
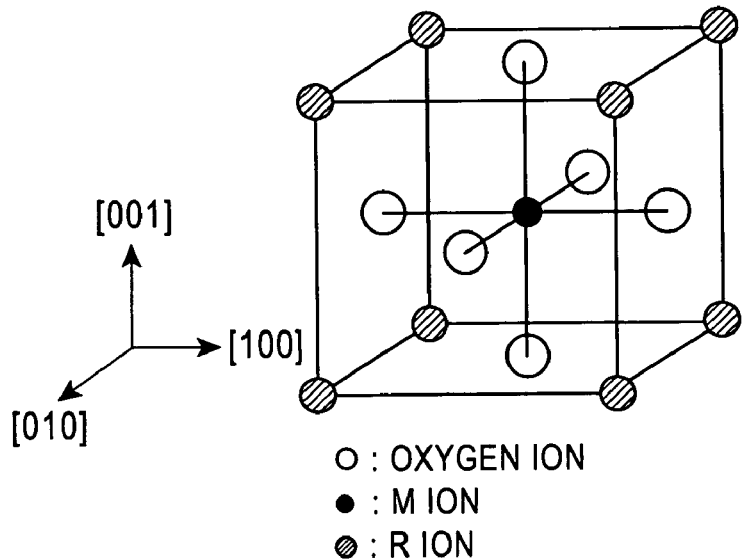
FIG. 5 is a schematic perspective view of a perovskite crystal structure ($RMO_3$).

As a unit lattice of a solid solution single crystal schematically shown in FIG. 5, a crystal structure according to the present invention has a perovskite structure ($RMO_3$) such that Pb ions are positioned at the vertices of the unit lattice; oxygen ions are positioned at the face centers of the unit lattice; and an M ion is positioned at the body center of the unit lattice. Additionally, it is necessary that the crystal structure is a complex perovskite structure of which the M ion positioned at the body center in FIG. 5 is composed of a plurality of element ions consisting of at least two elements (specifically, selected from Mg, Nb, Zn, Ti, and In) instead of one kind of element ion.

Furthermore, a structure disposing at least one of elements selected from the group consisting of Mn, Cr, Sb, W, Al, La, Li, and Ta at the body center position of the unit lattice or the position between lattices is also included in the scope of the present invention.

When a single-crystal plate cut out from a grown single-crystal ingot is in an unmodified state, the directions of electric dipoles in one domain are the same as each other in the polarization direction PD and in the directions orthogonal to the PD, but those of individual domains are in various different directions. Therefore, the single-crystal plate does not exhibit piezoelectricity and remains in an unpolarized state.

Consequently, the electric dipoles in a large number of domains are in various different directions until they are aligned in a polarization direction PD (in one direction) by selecting a polarizing temperature and an electric field to be applied, which are generally determined as polarization conditions, and polarizing by applying an electric field along the polarization direction PD. With this, for example, lead zinc niobate-lead titanate (PZN-PT) or lead magnesium niobate-lead titanate $Pb(Mg_{1/3}Nb_{2/3})O_3$—$PbTiO_3$ (PMN-PT) can have a high electromechanical coupling factor $k_{33}$ in the polarization direction PD of 80% or more.

However, alignment of the domains in the directions orthogonal to the polarization direction PD, which has an influence on the performance of a piezoelectric single-crystal device using an electromechanical coupling factor ($k_{31}$) in the lateral vibration mode, cannot be properly controlled in the above-mentioned polarization process. The alignment can be initially controlled by properly selecting the direction of the device to be cut out in a plane orthogonal to the polarization direction PD of the cut-out device material and the conditions for the polarization in the polarization direction PD, namely, in proper ranges of a polarizing temperature and an electric field to be applied.

Grounds for limiting the piezoelectric single-crystal device of the present invention will now be described.

(8) Shape of Single-crystal Device

A shape of the "piezoelectric single-crystal device" of the present invention is categorized by the following two-types according to its application.

Figure 2:
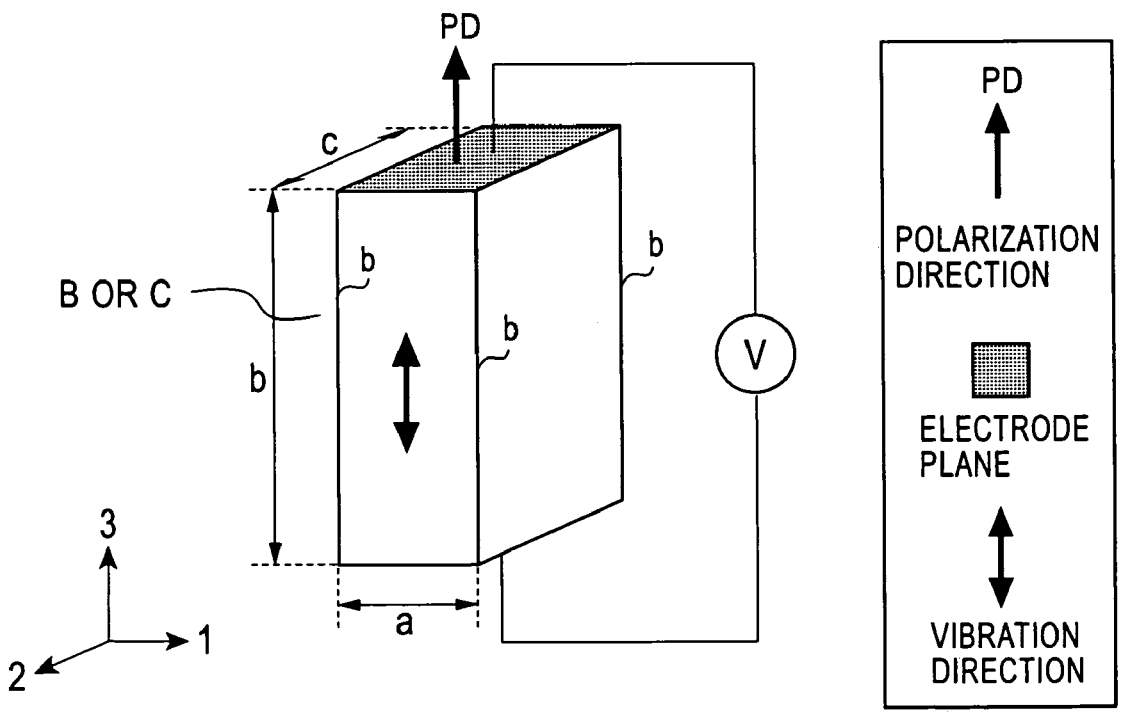
FIG. 2 is a diagram illustrating an orientation and a shape of a piezoelectric single-crystal device using the electromechanical coupling factor $k_{33}$ in a longitudinal vibration mode.
Figure 6:
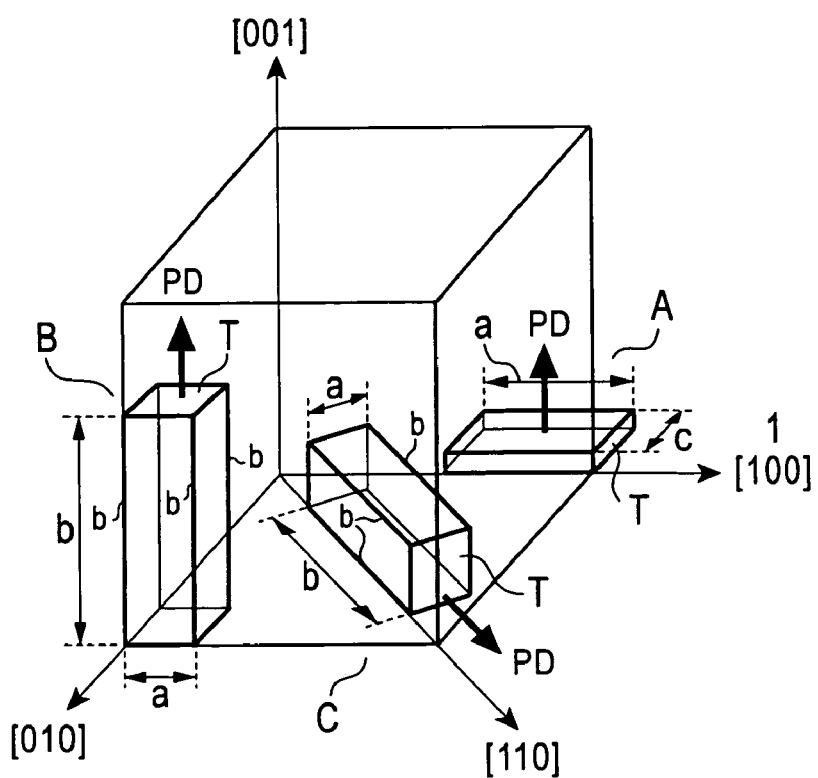
FIG. 6 is a diagram illustrating shapes of piezoelectric single-crystal devices A, B, and C according to the present invention and their positional relation.

(a) The Case Using an Electromechanical Coupling Factor $k_{33}$ in the Polarization Direction PD (Longitudinal Vibration Mode):

In the case of manufacturing a piezoelectric single-crystal device having the polarization direction PD in a direction of a piezoelectric single-crystal ingot and using an electromechanical coupling factor ($k_{33}$) in a vibration mode in the direction parallel to the PD, i.e., in the longitudinal vibration mode having the end face T in a (001) plane, the piezoelectric single-crystal device can most effectively achieve its function when it is shaped as the piezoelectric single-crystal device B or C shown in FIG. 6, a rectangular parallelepiped as shown in FIG. 2, a rod, or a plate. Therefore, such shapes are preferable. When the shortest-side length or the diameter of a device end face T, which is orthogonal to the polarization direction PD, is defined as a and the device length in the direction parallel to the polarization direction PD is defined as b, it is particularly desirable that the device has the a and the b satisfying the relational formula b/a≧2.5, more preferably b/a≧3.0. When b/a<2.5, the device length b is close to another length (a or c). Consequently, since the characteristic frequency becomes close to that of another direction, the vibration in the longitudinal direction only may not be effectively achieved.

When a piezoelectric single-crystal device is manufactured by using the above-mentioned piezoelectric single crystal so that the device has the polarization direction PD in a [110] direction of the ingot and uses an electromechanical coupling factor ($k_{33}$) in a vibration mode in the direction parallel to the PD, i.e., in the longitudinal vibration mode having the end face T in a (110) plane, it is also preferable that the device has the a and the b satisfying the relational formula b/a≧2.5 for the same reason as above.

Figure 3:
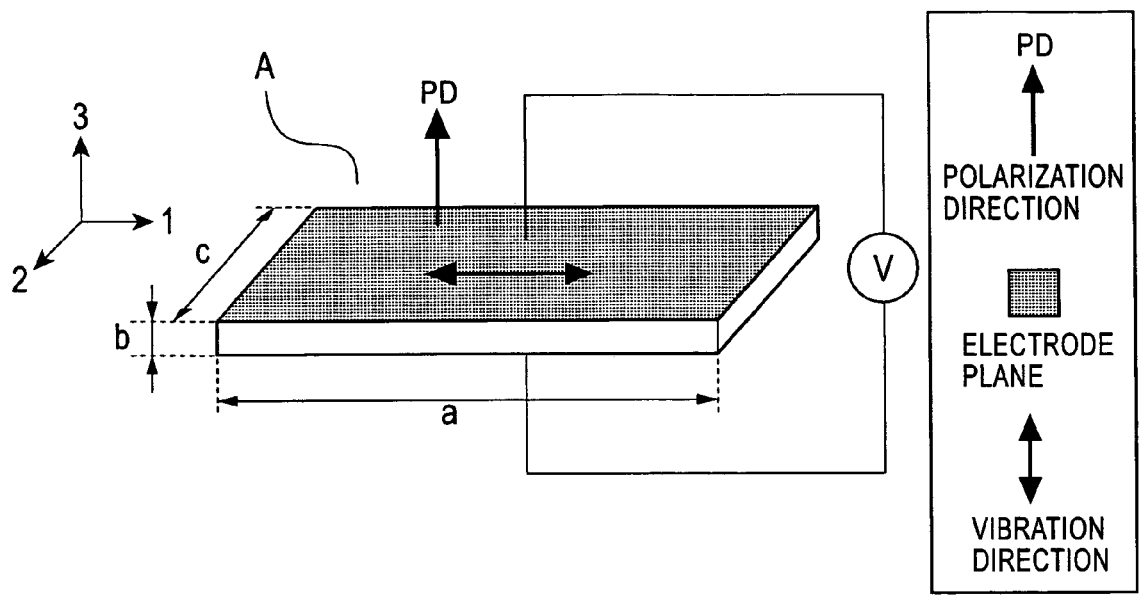
FIG. 3 is a diagram illustrating an orientation and a shape of a piezoelectric single-crystal device using the electromechanical coupling factor $k_{31}$ in a direction 1 (lateral vibration mode) approximately orthogonal to the polarization direction 3 (or PD).

(b) The Case Using an Electromechanical Coupling Factor $k_{31}$ in the Direction 1 (Lateral Vibration Mode) Orthogonal to the Polarization Direction PD:

In the case of manufacturing a piezoelectric single-crystal device having the polarization direction PD in a direction and using an electromechanical coupling factor ($k_{31}$) in a vibration mode in the [100] direction approximately orthogonal to the PD, i.e., in the lateral vibration mode having the end face T in a (100) plane, the piezoelectric single-crystal device can most effectively achieve its function when they are in the shape of a plate such as the piezoelectric single-crystal device A shown in FIG. 6 or shown in FIG. 3. Therefore, such a shape is preferable. In particularly, a desirable device shape is a plate (a/c>2.5, a>>b, and c>>b) preferably having a ratio of the length to the width (the aspect ratio: a/c) of 2.5 or more, more preferably a ratio (the aspect ratio: a/c) of 3 or more.

Figure 4:
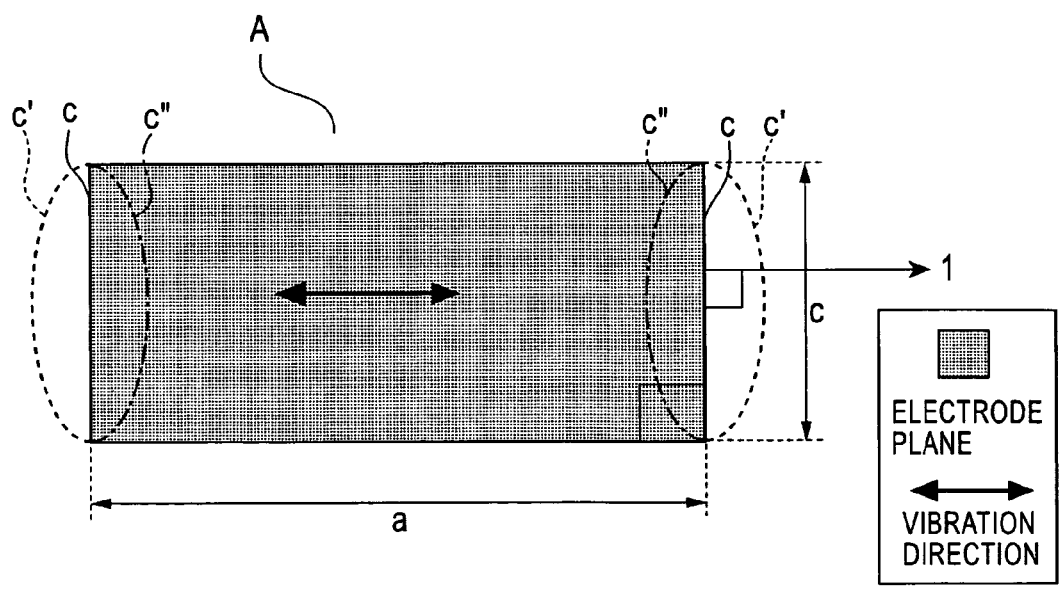
FIG. 4 is a diagram illustrating an end face shape of a piezoelectric single-crystal device using the electromechanical coupling factor $k_{31}$ in a direction 1 (lateral vibration mode) approximately orthogonal to the polarization direction 3 (or PD).

The both ends (short side c) of the plate-shaped device of the present invention may be curved in a convex manner c' (dotted line) or in a concave manner c" (alternate long and short dashed line) as shown in FIG. 4 according to its use. In addition, the device may be a square-shaped plate (a=c). The device end face in the present invention is the short side c which is orthogonal to the long side a in FIG. 4. Therefore, the direction 1 normal to the device end face (c) is parallel to the long side a of the device.

Figure 7A:
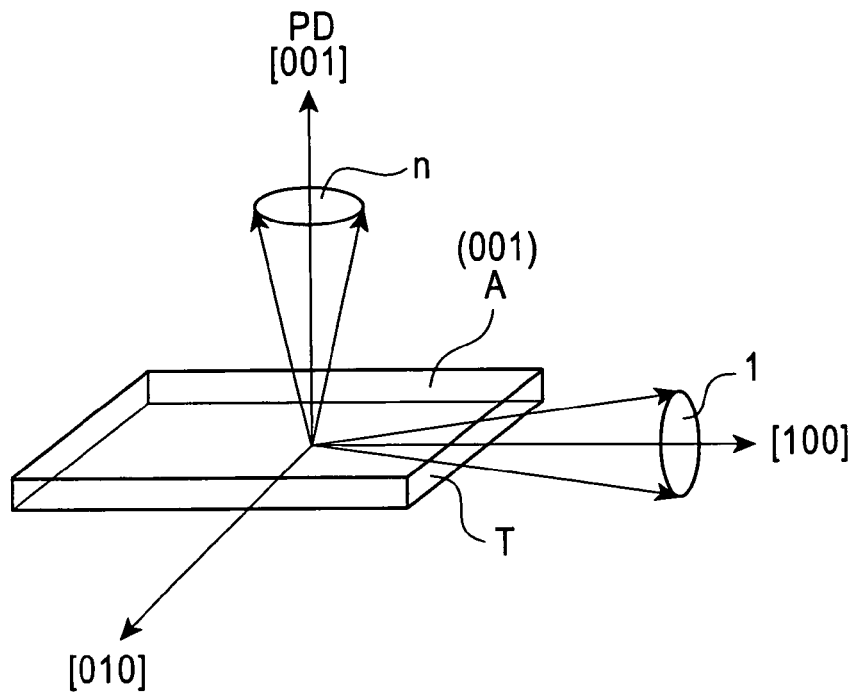
FIG. 7A is a diagram illustrating a direction 1 normal to a suitable end face T of a piezoelectric single-crystal device using the electromechanical coupling factor $k_{31}$ in the [100] direction (lateral vibration mode) approximately orthogonal to the polarization direction [001], PD.
Figure 7B:
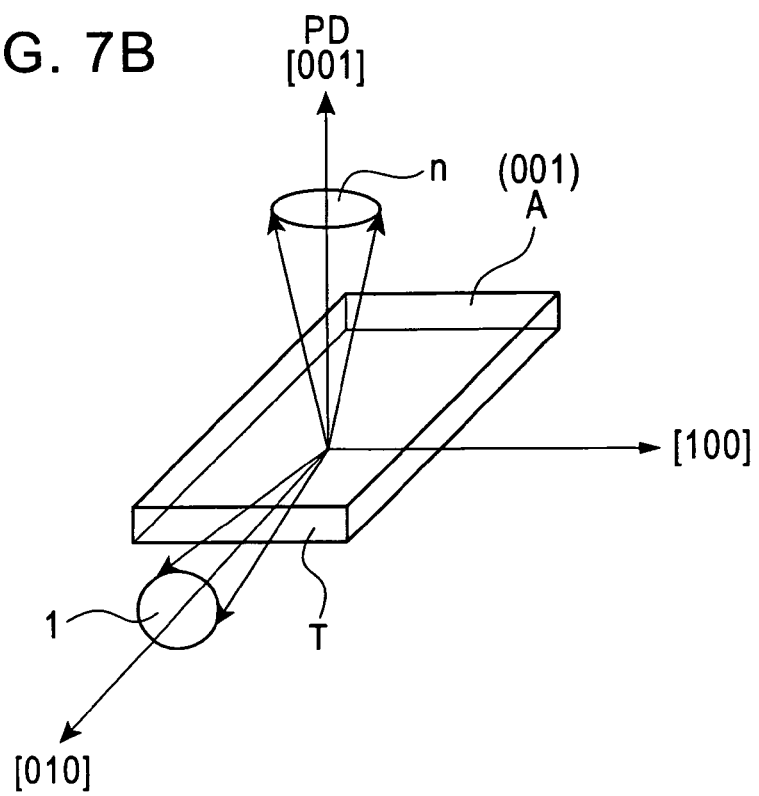
FIG. 7B is a diagram illustrating a direction 1 normal to a suitable end face T of a piezoelectric single-crystal device using the electromechanical coupling factor $k_{31}$ in the [010] direction (lateral vibration mode) approximately orthogonal to the polarization direction [001], PD.
Figure 7C:
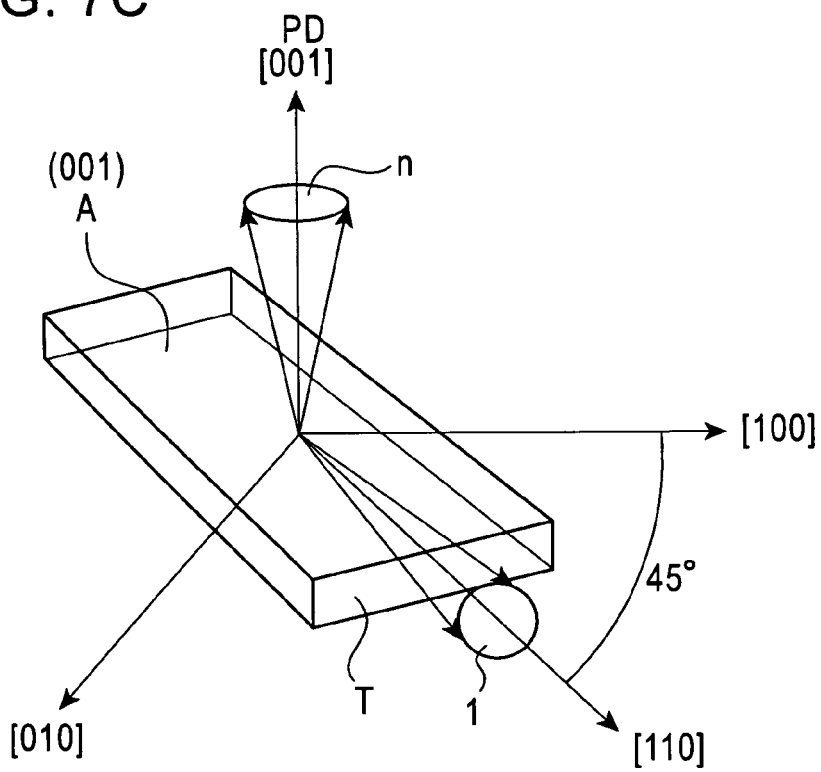
FIG. 7C is a diagram illustrating a direction 1 normal to a suitable end face T of a piezoelectric single-crystal device using the electromechanical coupling factor $k_{31}$ in the [110] direction (lateral vibration mode) approximately orthogonal to the polarization direction [001], PD.

(9) When the [100] Direction or the [010] Direction is Defined as 0°, the Direction 1 Normal to the End Face T of a Piezoelectric Device Using an Electromechanical Coupling Factor $k_{31}$ in the Direction 1 (Lateral Vibration Mode) Orthogonal to the Polarization Direction PD Resides within 0°±15° (in Other Words, within a Solid Angle of the [100] Axis ±15° or the [010] Axis ±15°) or within 45°±5° (in Other Words, within a Solid Angle of the [110] Axis ±50):

In the case of manufacturing a piezoelectric single-crystal device in such manner that the polarization direction PD is the [001] direction; the direction 1 normal to the device end face T resides in a plane perpendicularly cutting a (001) plane containing the [100] direction or the direction which are approximately orthogonal to the PD; and the device uses an electromechanical coupling factor ($k_{31}$) in the lateral vibration mode, when the [100] direction or the [010] direction is defined as 0°, it is preferable that the direction 1 normal to the end face T of the piezoelectric single-crystal device resides in a cone having a solid angle of 0°±15° (in other words, within a solid angle of the [100] axis ±15° or the [010] axis ±15°) as the piezoelectric single-crystal device A in FIG. 6 or as shown in FIG. 7A and FIG. 7B or resides in a cone having a solid angle of 45°±5° (in other words, within a solid angle of the [110] axis ±50) as shown in FIG. 7C. Here, when the polarization direction, i.e., the [001] direction is defined as 0°, the direction n normal to a largest face of these piezoelectric single-crystal devices resides in a cone having a solid angle of 0°±15° (in other words, within a solid angle of the [001] axis ±15°) as shown in FIG. 7A and FIG. 7B or resides in a cone having a solid angle of 0°±5° (in other words, within a solid angle of the [001] axis ±5°) as shown in FIG. 7C.

Grounds for limiting the direction normal to the end face T of a device using lateral vibration in such an angle range are thought as follows: when the [100] direction or the [010] direction is defined as 0° and the direction 1 normal to the end face T of the piezoelectric device resides in the range of an angle θ such as 15°<θ<40° or 50°<θ<75° which are out of the above-mentioned ranges, low-index crystal axis orientations such as <310>, <210>, and <320> are present between the <100> direction and the <110> direction in a plane orthogonal to the polarization direction <100> axis. Since the lateral vibration mode is dispersively generated in these directions, spurious impedance occurs in an impedance curve in the lateral vibration mode (turbulence in the curve) and a frequency range of the lateral vibration mode (more specifically, a difference between a resonant frequency $f_R$ and an antiresonant frequency $f_A$) is narrowed. It is thought that the electromechanical coupling factor $k_{31}$ in the lateral vibration mode decreases as a result.

(10) 1-3 Piezoelectric Composite

As shown in FIG. 1, a 1-3 piezoelectric composite of the present invention has a parallel complex configuration having a first phase of piezoelectric single crystals surrounded by a second phase formed of a polymer material (see Document: Seramikkusu Kogaku Handobukku (Handbook for Ceramic Engineering), ed. by The Ceramic Society of Japan, pp. 1917-1925). In the present invention, when the 1-3 piezoelectric composite is formed by using a plurality of the piezoelectric single-crystal devices using the $k_{33}$ in the longitudinal vibration mode, it is preferable that the devices are arrayed so as to have their end faces T orthogonal to the polarization direction in one plane. Additionally, the number of the piezoelectric single-crystal devices used for forming one 1-3 piezoelectric composite and an alignment pattern of the piezoelectric single-crystal devices are determined according to its application.

An appropriate method for manufacturing a piezoelectric single-crystal device of the present invention will now be described.

The method for manufacturing a piezoelectric single-crystal device of the present invention includes the steps of producing a single-crystal ingot; cutting the single-crystal ingot into a single-crystal device material having a predetermined shape in a predetermined direction; and mainly polarizing the single-crystal device material by applying an electric field under predetermined conditions. The method may further include a subsidiary polarization step carried out before or after the main polarization step. The method for manufacturing the single-crystal device is not limited to the above-mentioned process. For example, after the determination of crystallographic orientation, the single-crystal ingot may be polarized and then be cut into a single-crystal device material having a predetermined shape in a predetermined direction.

Grounds for the limitation in each step of the manufacturing method according to the present invention will now be described.

(1) Manufacturing of Piezoelectric Single-crystal Ingot:

In a method for producing a single-crystal ingot having a composition containing 35 to 98 mol % lead magnesium niobate [Pb(Mg$_{1/3}$Nb$_{2/3}$)O$_3$] or lead zinc niobate [Pb(Zn$_{1/3}$Nb$_{2/3}$)O$_3$], 0.1 to 64.9 mol % lead titanate [PbTiO$_3$], and 0.05 to 30 mol % lead indium niobate [Pb(In$_{1/2}$Nb$_{1/2}$)O$_3$], calcium substituting for 0.05 to 10 mol % lead in the composition, and further 5 mol % or less in total of at least one element selected from the group consisting of Mn, Cr, Sb, W, Al, La, Li, and Ta, if necessary, the single-crystal may be obtained by melting a powder, calcined material, or sintered compact of the above-mentioned composition in a flux and then solidifying it by cooling; or by melting the composition by heating to above its melting point and then solidifying it in one direction. As the former method, the Solution Bridgman method and the Top Seeded Solution Growth (TSSG) method are known. As the latter method, the Melt Bridgman method and the Czochralski (CZ) method are known. The present invention is not limited to these methods. In particular, when lead zinc niobate-lead titanate (PZN-PT) is used, the Solution Bridgman method and the TSSG method are preferable.

(2) Determination of Crystallographic Orientation of Piezoelectric Single-Crystal Ingot:

In the present invention, a method for determining the crystallographic orientation of the piezoelectric single-crystal ingot is not specifically defined. For example, when the polarization direction PD is in a [001] direction of the single-crystal ingot, the [001] axis orientation of the single-crystal ingot is roughly determined by the Laue method. Simultaneously, crystallographic orientations such as the [010] axis orientation and the [100] axis orientation, which are approximately orthogonal to the [001] axis orientation, and orientations of the [110], [101], and [011] axes, if necessary, are roughly determined.

Then, the crystallographic {100} plane of the ingot which is orthogonal to any one of crystal axes such as the [001] axis, [010] axis, and [100] axis is polished. Furthermore, a correct orientation is determined by using an X-ray direction finder, and a deviation of the above-mentioned polished face is corrected.

(3) Rough Cutting (Cutting Out Wafers Having an Appropriate Thickness):

In the present invention, a method for roughly cutting the single-crystal ingot is not specifically defined. For example, when the polarization direction PD is in a [001] direction of the single-crystal ingot, the single-crystal ingot is cut at a plane being parallel or orthogonal to the polished {100} plane by using a cutting tool such as a wire saw or an inner diamond saw to obtain a wafer having an appropriate thickness. Additionally, after the cutting, a chemical etching process using an etching solution may be performed if necessary.

(4) Polishing (Polishing of Wafer to a Predetermined Thickness):

The wafer is ground or polished by using an abrader or a grinder such as a lapping machine and a polishing machine so that the wafer has a predetermined thickness. Additionally, after the polishing, a chemical etching process using an etching solution may be performed if necessary.

(5) Preparation of Single-crystal Plate (Single-crystal Device):

In the present invention, a method for preparing a single-crystal plate is not specifically defined. The cutting direction of the single-crystal plate depends on the polarization direction and the longitudinal vibration mode or the lateral vibration mode. Each exemplary method for cutting out the respective three types of the single-crystal devices according to the present invention will now be described.

(a) A Case Using Electromechanical Coupling Factor ($k_{31}$) in the Lateral Vibration Mode:

As shown in FIG. 7A, FIG. 7B, and FIG. 7C, in the case of a piezoelectric single-crystal device having the polarization direction PD in a [001] direction and having the end face T in a plane perpendicularly cutting a (001) plane containing the [100] direction and the [010] direction which are approximately orthogonal to the PD, single-crystal plates having a predetermined shape are cut out from the wafer by using a precise cutter such as a dicing saw or a cutting saw so that when the [100] direction or the [010] direction is defined as 0°, the direction 1 normal to the end face T resides in a cone having a solid angle of 0°±15° (in other words, within a solid angle of the [100] axis ±15° or the [010] axis ±15°) or resides in a cone having a solid angle of 45°±5° (in other words, within a solid angle of the [110] axis ±5°).

(b) A case of Piezoelectric Single-Crystal Device Having the Polarization Direction PD in a [001] Direction and Using an Electromechanical Coupling Factor ($k_{33}$) in a Vibration Mode in the Direction Parallel to the PD, i.e., in the Longitudinal Vibration Mode Having the End Face T in a (001) Plane:

As the piezoelectric single-crystal device B shown in FIG. 6, piezoelectric single-crystal devices are cut out by using the above-mentioned precise cutter so that the end face T resides in the (001) plane and the longitudinal direction of the device is in the [001] direction.

(c) A case of Piezoelectric Single-crystal Device Having the Polarization Direction PD in a [110] Direction and Using an Electromechanical Coupling Factor ($k_{33}$) in a Vibration Mode in the Direction Parallel to the PD, i.e., in the Longitudinal Vibration Mode Having the End Face T in a (110) Plane:

As the piezoelectric single-crystal device C shown in FIG. 6, piezoelectric single-crystal devices are cut out by using the above-mentioned precise cutter so that the end face T resides in the (110) plane and the longitudinal direction of the device is in the [110] direction.

(6) Beveling:

When a piezoelectric single-crystal device is a rectangular parallelepiped and uses an electromechanical coupling factor ($k_{33}$) in the longitudinal vibration mode as shown in FIG. 2 and the piezoelectric single-crystal devices B and C in FIG. 6, four edges b in the longitudinal direction of the rectangular parallelepiped may be beveled in order to prevent the occurrence of chipping at the edges b during the polarization.

(7) Forming of Electrode:

It is necessary to previously form an electrode for applying an electric field in the main polarization step, and further in the subsidiary polarization step.

Before the main polarization step, electrodes are formed on opposing end faces that are orthogonal to the main polarization direction of the prepared single-crystal device material by forming a Cr—Au film (a first layer: Cr layer having a thickness of about 50 nm, a second layer: Au layer having a thickness of about 100 to 200 nm) by sputtering, a gold film by plasma deposition, or a silver film by screen printing; and firing it.

In addition, before the subsidiary polarization step, electrodes are formed on opposing end faces that are orthogonal to the subsidiary polarization direction by the same method as above.

When the main polarization step is performed after the subsidiary polarization step or the subsidiary polarization step is performed after the main polarization step, the polarization in the second polarization step is unstable if the electrode used for the first polarization step remains. Therefore, it is necessary to completely remove the electrode used for the first polarization step by using an appropriate chemical etching solution and acid.

(8) Main Polarization Step:

When a single crystal cut out from a grown single-crystal ingot is in an unmodified state, the directions of electric dipoles in one domain are the same as each other in the polarization direction PD and in the directions orthogonal to the PD, but those of individual domains are in various different directions. The electric dipoles in the individual domains are in various different directions until they are aligned in a polarization direction PD (in one direction) by selecting a polarizing temperature and an electric field to be applied, which are generally determined as polarization conditions, and polarizing by applying an electric field along the polarization direction PD. With this, for example, lead zinc niobate-lead titanate (PZN-PT) or lead magnesium niobate-lead titanate (PMN-PT) can have a high electromechanical coupling factor $k_{33}$ in the polarization direction PD of 80% or more.

However, alignment of the domains in the directions orthogonal to the polarization direction PD, which has an influence on the performance of a piezoelectric single-crystal device using an electromechanical coupling factor ($k_{31}$) in the lateral vibration mode, cannot be properly controlled in the above-mentioned polarization process. The alignment can be initially controlled by properly selecting the direction of the device to be cut out in a plane orthogonal to the polarization direction PD of the cut-out device material and the conditions for the polarization in the polarization direction PD, namely, in proper ranges of a polarizing temperature and an electric field to be applied.

In the main polarization step of the present invention, a direct electric field of 350 to 1500 V/mm is applied to the cut-out single-crystal device material along a polarization direction PD at a temperature range of 20 to 200° C. When the temperature is lower than 20° C. which is the lower limit of the above-mentioned appropriate temperature range or when the applied electric field is less than 350 V/mm which is the lower limit of the direct electric field range, the polarization is insufficient. When the temperature is higher than 200° C. which is the upper limit of the above-mentioned appropriate temperature range or when the applied electric field is higher than 1500 V/mm which is the upper limit of the direct electric field range, over poles occur to deteriorate the piezoelectric characteristics. Strain in the crystal is increased due to the excessive electric field. This may cause breakage.

The polarization time is preferably controlled according to a polarization temperature and an electric field to be applied which are determined within the above-mentioned appropriate ranges. The upper limit of the polarization time is 180 min.

Furthermore, in the main polarization step, it is more preferable that a direct electric field of 350 to 1500 V/mm is applied to the cut-out single-crystal device material along the polarization direction 3 at a temperature higher than Curie temperature (Tc) of the single-crystal device material, preferably at a temperature range of 180 to 300° C., and then the device material is cooled (electric field cooling) to a room temperature while applying the direct electric field. The electric dipoles are removed once by raising the temperature higher that the Curie temperature (Tc), and then the direction of the electric dipoles are more regularly aligned by cooling the temperature lower than the Curie temperature. When the temperature is lower than the Curie temperature, a part of the electric dipoles remains. This causes insufficient polarization. When the applied electric field is less than 350 V/mm which is the lower limit of the above-mentioned appropriate electric field range to be applied, the polarization is insufficient. When the applied electric field is higher than 1500 V/mm which is the upper limit of the appropriate electric field range, over poles occur to deteriorate the piezoelectric characteristics. Furthermore, strain in the crystal is increased due to the excessive electric field. This causes breakage. Additionally, the cooling rate is preferably controlled not to generate cracks in the device during the cooling.

Figure 8:
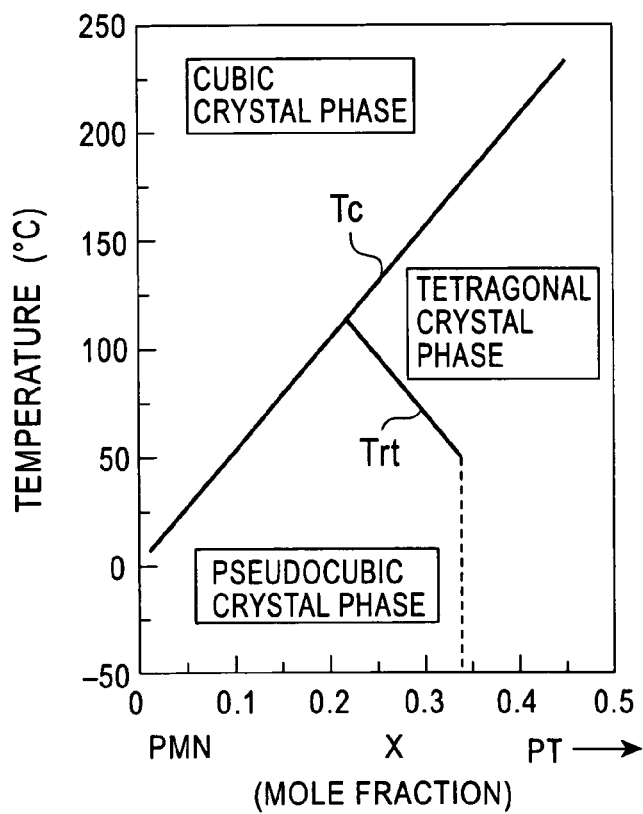
FIG. 8 is a phase diagram of PMN-PT (PMNT).
Figure 9:
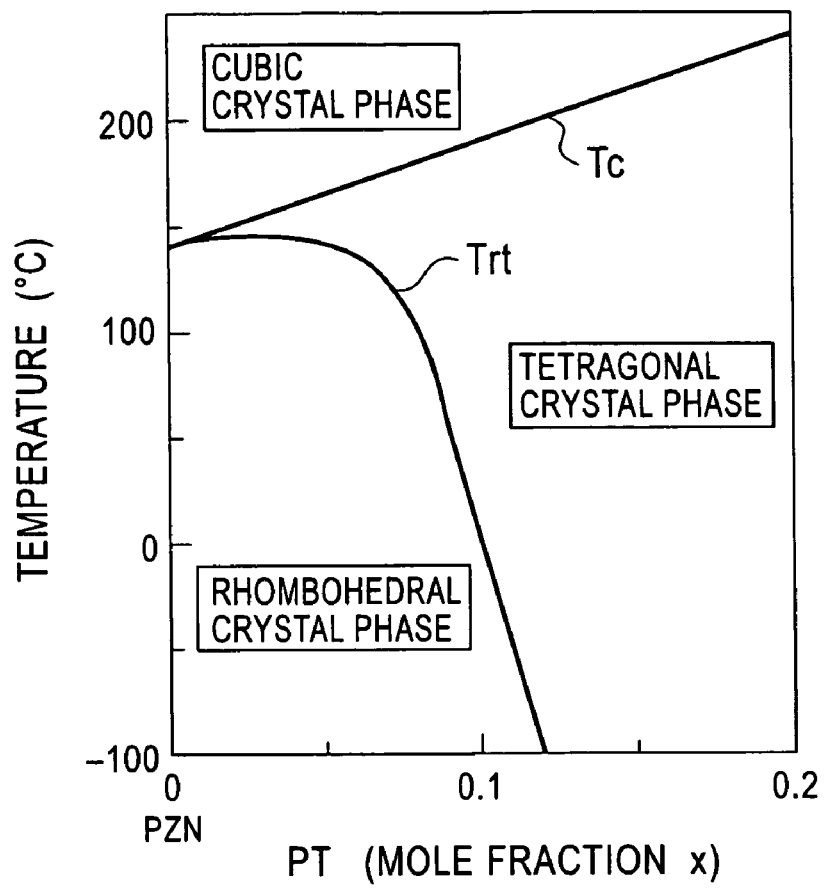
FIG. 9 is a phase diagram of PZN-PT (PZNT).

The Curie temperature can be expressed by, for example, the Tc lines in FIG. 8 and FIG. 9. The temperature shown by the Tc line is a transition temperature that the piezoelectricity or ferroelectricity disappear because the electric dipoles are not aligned and reside in various different directions when the temperature is higher than that shown by the Tc line. The transition temperature is determined depending on the composition and the material structure.

Additionally, as described above, the process for the polarizing the single-crystal device is not limited to the above-mentioned processes. For example, after the determination of the crystallographic orientation, the single-crystal ingot may be polarized and then be cut out to a single-crystal device material having a predetermined-shape in a predetermined direction.

(9) Subsidiary Polarization Step:

The piezoelectric single-crystal device is mainly polarized by the above-mentioned main polarization step. However, it is effective to control the alignment of ferroelectric domains in the direction orthogonal to the polarization direction PD by the subsidiary polarization step carried out before or after the main polarization step.

The electric field applied along the direction orthogonal to the polarization direction PD may be an attenuation electric field, in addition to a direct electric field, a pulse electric field, an alternating electric field, and a steady-state electric field thereof. The conditions such as the electric field intensity, the electric-field application time, and the temperature can be experimentally determined according to the characteristics of the individual piezoelectric single-crystal devices and the desired value of the electromechanical coupling factor $k_{31}$ in the direction orthogonal to the polarization direction. In order to obtain the advantageous effect of the subsidiary polarization, it is preferable that the range of the subsidiary polarization temperature is 25° C. to a phase transition temperature (for example, temperature shown by the Trt lines in FIG. 8 and FIG. 9) and the range of the electric field to be applied is 350 to 1500 V/mm. The polarization time is preferable determined according to the above-mentioned preferable ranges of the polarization temperature and the electric field intensity to be applied. In particular, the preferable polarization time is 10 min to 2 hr.

Figure 10:
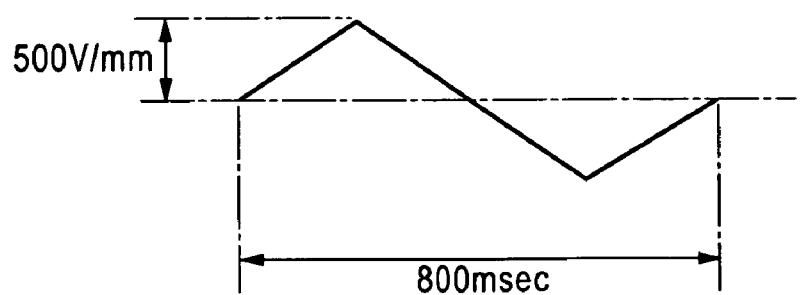
FIG. 10 is a waveform diagram of a bipolar triangular pulse.

Additionally, unipolar and bipolar pulses such as an alternating triangular wave shown in FIG. 10, in addition to a square wave, can be used as the above-mentioned pulse electric field.

INDUSTRIAL APPLICABILITY

According to the present invention, a piezoelectric single-crystal device having a performance equivalent to that of a lead-based perovskite-structure single crystal which is free from additives such as lead indium niobate or Ca can be produced. Decreases in the crystal yield and the wafer yield are improved by suppressing the occurrence of a pyrochlore phase during the growth of the lead-based perovskite-structure single crystal which is free from additives such as lead indium niobate or Ca and the generation of heat cracking during the cooling carried out after the growth of the single crystal. Simultaneously, a decrease in the yield of single-crystal plates, which is caused by the occurrence of chipping during the cut-out of the single-crystal plates from the resulting wafer, is also improved. With this, since the single-crystal device can be produced at a reasonably inexpensive cost compared with the piezoelectric single-crystal device produced from a lead-based perovskite-structure single crystal not containing additives such as lead indium niobate or Ca, the piezoelectric single-crystal device can be broadly applied to fields where the conventional piezoelectric single-crystal device cannot be applied.

EXAMPLE 1

A $[Pb(Ca)(Mg_{1/3}Nb_{2/3})O_3]_{0.65}[Pb(Ca)(In_{1/2}Nb_{1/2})O_3]_{0.03}$ $[Pb(Ca)TiO_3]_{0.32}$ (PMN65/PIN03-PT32(Cal)) crystal of an example according to the present invention was grown by mixing powder of 65 mol % calcium-substituted lead magnesium niobate $[Pb(Ca)(Mg_{1/3}Nb_{2/3})O_3]$ which was prepared by substituting Ca for 1 mol % lead (Pb) of 65 mol % lead magnesium niobate $[Pb(Mg_{1/3}Nb_{2/3})O_3]$, 32 mol % lead titanate $[PbTiO_3]$, and 3 mol % lead indium niobate $[Pb(In_{1/2}Nb_{1/2})O_3]$; firing the resulting mixture; casting and putting it into a platinum crucible of 50 mm in diameter; heating it to 1350° C. in a vertical electric furnace to a melt; and solidifying it in one direction (Melt Bridgman method) by moving the crucible downward in a temperature gradient of 20° C./cm at a rate of 0.5 mm/h.

For comparison, a lead magnesium niobate-lead titanate $[Pb(Mg_{1/3}Nb_{2/3})O_3]_{0.68}[PbTiO_3]_{0.32}$ (PMN68-PT32) crystal of a comparative example was also grown by putting a sintered body of a solid solution composed of 68 mol % lead magnesium niobate $[Pb(Mg_{1/3}Nb_{2/3})O_3]$ and 32 mol % lead titanate $[PbTiO_3]$ into a platinum crucible of 50 mm in diameter; heating it to 1330° C. in a vertical electric furnace to a melt; and solidifying it in one direction (Melt Bridgman method) by moving the crucible downward in a temperature gradient of 20° C./cm at a rate of 0.5 mm/h. Five for each of the individual crystals were grown. Each grown crystal was investigated for the occurrences of a pyrochlore phase and heat cracking, the crystal yield, and the wafer yield. Table 1 shows the results.

The presence or absence of the pyrochlore phase was confirmed by visually observing the color and transparency of the single-crystal ingots and wafers. Since the transparency of the pyrochlore phase is higher than that of a perovskite phase, the presence can be distinctly confirmed. The presence or absence of the heat cracking was visually observed by transmitting light to the wafer and further, if necessary, spraying a dye penetrant for flaw detection and developing it. Wafers having two or three cracks were judged as being few.

With the results shown in Table 1, it can be understood that the PMN65/PIN03-PT32(Cal) single crystal of the example according to the present invention is significantly improved in terms of the crystal yield and the wafer yield compared with the PMN68-PT32 single crystal of the comparative example.

EXAMPLE 2

The two types of the wafers prepared in EXAMPLE 1 were processed into rectangular plates having an end face in a desired orientation. Here, the [001] direction is defined as the direction normal to a plane having the largest area of the wafer. Single-crystal plates of length 13 mm×width 4 mm×thickness 0.36 mm were cut out by using a dicing saw such that the directions normal to each end face reside in the [100] direction or the [010] direction. The single-crystal plates were prepared 50 pieces for each type of the wafers. The presence or absence of chipping when the two types of the wafers were processed, a ratio of the wafers with the chipping to the total (50 pieces), and a yield of the single-crystal plate (single-crystal plate yield=100%−chipping occurrence ratio) were investigated. Table 2 shows the results. The dicing process was performed at a cutting rate of 0.2 mm/s.

The presence or absence of the chipping was determined by observing the peripheries of the single-crystal plates with a stereomicroscope. When the single-crystal plate had one or more cracks of 30 μm of more in size, it was determined that the chipping is present.

With the results shown in Table 2, it can be understood that the occurrence of the chipping during the dicing process is notably suppressed in the PMN65/PIN03-PT32(Cal) single crystal of the example according to the present invention compared with that in the PMN68-PT32 single crystal of the comparative example.

EXAMPLE 3

In order to produce piezoelectric single-crystal devices using a lateral vibration mode, single-crystal device materials of 13 mm×4 mm×0.36 mm were cut out from the two types of the wafers prepared in EXAMPLE 1 by using a dicing saw so as to have a size of 0.36 mm in the [001] direction, 4 mm in the [010] direction, and 13 mm in the [100] direction as shown in the single crystal device A in FIG. 6. Gold electrodes were produced on the opposing top and bottom faces in (100) planes of the produced single-crystal device material by forming a Cr—Au film (a first layer: Cr layer having a thickness of about 50 nm, a second layer: Au layer having a thickness of about 100 to 200 nm) by sputtering. Then, the single-crystal device material was put into a silicon oil bath of 40° C. and applied with a direct electric field of 700 V/mm for 1 hr for polarization. Thus, samples for evaluating piezoelectric characteristics were prepared. The piezoelectric characteristics, i.e., the electromechanical coupling factors ($k_{31}$) and the piezoelectric constants ($d_{31}$) of the piezoelectric single-crystal device produced from PMN65/PIN03-PT32(Cal) of the example according to the present invention and the piezoelectric single-crystal device produced from the PMN68-PT32 single crystal of the comparative example were measured. Table 3 shows the results. For reference, the piezoelectric characteristics of a piezoelectric device produced from a sintered body of lead zirconium titanate (Pb(Zr, Ti)O$_3$: PZT), which is mainly used as a conventional piezoelectric device material, are also shown in Table 3. The $k_{31}$ and the $d_{31}$ of the piezoelectric single-crystal device after the polarization were calculated from the impedance curve and the phase in the $k_{31}$ mode, which were obtained by using an Impedance/Gain-Phase Analyzer (a product of HP Company, device number: HP4194A), using a known equation (Electronic Materials Manufacturers Association of Japan Standard: EMAS-6008, 6100).

With the results shown in Table 3, it can be understood that the electromechanical coupling factor ($k_{31}$) and the piezoelectric constant ($d_{31}$) in the lateral vibration mode of the piezoelectric single-crystal device produced from the PMN65/PIN03-PT32(Cal) single crystal of the example according to the present invention were equivalent to those of the piezoelectric single-crystal device produced from the PMN68-PT32 single crystal of the comparative example and were significantly improved compared with those of the piezoelectric device produced from the sintered body of lead zirconate titanate (Pb(Zr, Ti)O$_3$: PZT) of the conventional example.

EXAMPLE 4

In order to comprehend a relationship between the direction 1 normal to an end face T and the crystallographic orientation in a piezoelectric single-crystal device using a lateral vibration mode, various single-crystal device materials were prepared. As shown by the single-crystal device A in FIG. 6, in the PMN65/PIN03-PT32(Cal) single-crystal plate and the PMN68-PT32 single-crystal plate, the polarization direction was defined as the [001] direction; and the face of the largest area of the piezoelectric single-crystal device of 13 mm×4 mm×0.36 mm was defined as a (001) plane orthogonal to the [001] direction. The various single-crystal device materials were cut out with a dicing saw while changing the direction 1 normal to the end face T of 4 mm×0.36 mm used in the lateral vibration mode in 5° increments in the range of 0° to 90° when the [100] direction was defined as 0°, the [110] direction was defined as 45°, and the [010] direction was defined as 90°. Gold electrodes were produced on the opposing top and bottom faces in (100) planes of the produced single-crystal device material as in EXAMPLE 3. Then, the single-crystal device material was polarized as in EXAMPLE 3.

The piezoelectric single-crystal device after the polarization was subjected to the measurement of the electromechanical coupling factor ($k_{31}$) in the lateral vibration mode by the method as in EXAMPLE 3. Table 4 shows the results. Here, the range of the direction 1 normal to the end face T was selected so as to reside in 0° to 90° against the [100] direction. This is necessary and sufficient angle range for obtain information relating to all directions in a {100} plane because of the symmetry of a cubic crystal. For reference, the electromechanical coupling factor ($k_{31}$) in the lateral vibration mode of the piezoelectric device produced from a sintered body of lead zirconate titanate (Pb(Zr, Ti)O$_3$: PZT) of a conventional example is also shown in Table 4. The PZT is a sintered body and does not have anisotropy arising from a crystal orientation, unlike the above-mentioned piezoelectric single crystals. Consequently, the electromechanical coupling factor ($k_{31}$) in the lateral vibration mode of the PZT is constant over all crystal orientations independent of the direction 1 normal to the end face T.

With the results shown in Table 4, it can be understood that when the [100] direction is defined as 0°, a suitable orientation of the direction 1 normal to the end face T of a piezoelectric single-crystal device using a lateral vibration mode is the direction 1 normal to the end face T residing within the range of 0° to 15° (the angle range of ±15° against the [100] direction, which is equal to 0°±15° because of the above-mentioned symmetry) and within the range of 45±5° (the angle range of ±5° against the [110] direction, which is equal to ±45±5° because of the above-mentioned symmetry). Additionally, it was confirmed that when the [010] direction is defined as 0°, a suitable orientation of the direction 1 normal to the end face T of a piezoelectric single-crystal device using a lateral vibration mode is the direction 1 normal to the end face T residing within 0° to 15° (the angle range of ±15° against the [010] direction, which is equal to 0°±15° because of the above-mentioned symmetry) and within 45±5° (the angle range of ±5° against the [110] direction, which is equal to ±45±5° because of the above-mentioned symmetry).

In this EXAMPLE, a suitable orientation was confirmed for a (001) plane which is orthogonal to the [001] direction and has the face having the largest-area of the piezoelectric single-crystal device of 13 mm×4 mm×0.36 mm when the single crystal plate has the polarization direction in a [001] direction. Furthermore, it was confirmed that a favorable $k_{31}$ can be obtained when the direction 1 normal to the end face T resides within a solid angle of 0°±15° and 45°±5° shown in FIG. 7A, FIG. 7B, and FIG. 7C.

Both the PMN65/PIN03-PT32(Cal) single crystal and the PMN68-PT32 single crystal have a perovskite structure and contain low-index crystal axes such as [310], [210], and [320] between the [100] direction and the [010] direction in a (001) plane.

In the piezoelectric single-crystal device produced from the PMN65/PIN03-PT32(Cal) single crystal and the PMN68-PT32 single crystal, the angle differences between the low-index crystal axes and the direction 1 normal to the end face T using the lateral vibration mode of the piezoelectric single-crystal device are sufficiently large when the orientation of the end face resides within the above-mentioned suitable angle range. Consequently, dispersion to the low-index crystal axes is suppressed. Thus, it is thought that the electromechanical coupling factor ($k_{31}$) in the lateral vibration mode of the end face T can be increased.

On the other hand, when the orientation of the end face of a piezoelectric single-crystal device using a lateral vibration mode resides out of the suitable angle range, the influence of the low-index crystal axes such as [310], [210], and [320] axes increases, and the lateral vibration is dispersed to the direction 1 normal to the end face T and directions of these low-index crystal axes. Consequently, the electromechanical coupling factor ($k_{31}$) in the lateral vibration of the end face is decreased. Thus, it is thought that the piezoelectric single-crystal device becomes improper as a device using the lateral vibration mode of the end face.

Additionally, it was understood that the electromechanical coupling factor ($k_{31}$) in the lateral vibration mode of the piezoelectric single-crystal device produced from the PMN65/PIN03-PT32(Cal) single crystal was equivalent to that of the piezoelectric single-crystal device produced from the PMN68-PT32 single crystal and was significantly improved compared with that of the piezoelectric device produced from the sintered body of lead zirconate titanate (Pb (Zr, Ti)O$_3$: PZT).

EXAMPLE 5

In order to produce piezoelectric single-crystal devices using a longitudinal vibration mode, single-crystal rectangular parallelepipeds of 4 mm×4 mm×10 mm were cut out from the a PMN65/PIN03-PT32(Cal) single-crystal plate by using a wire saw so as to have a size of 10 mm in the [001] direction and 4 mm in both the [010] and the [100] directions as shown in the single crystal device B in FIG. 6. Gold electrodes were produced on the opposing top and bottom faces in (001) planes of the single-crystal rectangular parallelepiped as in EXAMPLE 3, and this single-crystal device material was applied with a direct electric field of 0.7 kV/mm along the [001] direction in a silicon oil bath of 40° C. for 1 hr for polarization. Thus, samples for evaluating piezoelectric characteristics were prepared. For comparison, samples were similarly cut out from the PMN68-PT32 single crystal and polarized under the same conditions as above.

The piezoelectric characteristics, i.e., the electromechanical coupling factor ($k_{33}$) and the piezoelectric constant ($d_{33}$) in the longitudinal vibration mode of the piezoelectric single-crystal device produced from PMN65/PIN03-PT32(Cal) of the example according to the present invention and the piezoelectric single-crystal device produced from the PMN68-PT32 single crystal of the comparative example were measured. Table 5 shows the results. For reference, the piezoelectric characteristics of a piezoelectric device produced from a sintered body of lead zirconate titanate (Pb(Zr, Ti)O$_3$: PZT), which is mainly used as a conventional piezoelectric device material, are also shown in Table 5.

The $k_{33}$ of the piezoelectric single-crystal device after the polarization was calculated using a known equation (Electronic Materials Manufacturers Association of Japan Standard: EMAS-6008, 6100) by using an Impedance/Gain-Phase Analyzer (a product of HP Company, device number: HP4194A). The piezoelectric constant ($d_{33}$) was directly measured by using a $d_{33}$ meter made in China (PIEZO $d_{33}$ METER Model ZJ-3D: a product of INSTITUTE of ACOUSTICS ACADEMIA SINICA).

With the results shown in Table 5, it can be understood that the electromechanical coupling factor ($k_{33}$) and the piezoelectric constant ($d_{33}$) in the longitudinal vibration mode of the piezoelectric single-crystal device produced from the PMN65/PIN03-PT32(Cal) single crystal of the example according to the present invention were equivalent to those of the piezoelectric single-crystal device produced from the PMN68-PT32 single crystal of the comparative example and were significantly improved compared with those of the piezoelectric device produced from the sintered body of lead zirconium titanate (Pb(Zr, Ti)O$_3$: PZT) of the conventional example.

EXAMPLE 6

In order to produce piezoelectric single-crystal devices using a longitudinal vibration mode, PMN65/PIN03-PT32 (Cal) single-crystal rectangular parallelepipeds of 1 mm×1 mm×20 mm were cut out from the PMN65/PIN03-PT32(Cal) single-crystal plate by using a wire saw so as to have a size of 20 mm in the [001] direction and 1 mm in both the [010] and the [100] directions as shown in the piezoelectric single-crystal device B in FIG. 6. Gold electrodes were produced on the opposing top and bottom faces in (001) planes of the single-crystal rectangular parallelepiped as in EXAMPLE 3, and this single-crystal device material was applied with a direct electric field of 0.7 kV/mm along the [001] direction in the atmosphere of 40° C. for 1 hr for polarization. Thus, 400 piezoelectric single-crystal devices were prepared and arrayed in parallel at 1 mm intervals in a jig so that each end face resides in one plane as shown in FIG. 1. The gaps were filled with an epoxy resin. Thus, a 1-3 piezoelectric composite of 20×20 pieces was produced.

When the same process as above was conducted using the PMN68-PT32 single crystal, a large number of cracks and chipping occurred. Consequently, 400 piezoelectric single-crystal devices necessary for producing a 1-3 piezoelectric composite could not obtained. Thus, the 1-3 piezoelectric composite could not be produced.

The piezoelectric characteristics ($k_{33}$, $d_{33}$) of the 1-3 piezoelectric composite produced from the PMN65/PIN03-PT32 (Cal) single crystal were measured by the same method as that in EXAMPLE 5 and were compared with those of a conventional 1-3 piezoelectric device which was produced from a sintered body of lead zirconate titanate (Pb(Zr, Ti)O$_3$: PZT) so as to be equivalent to the 1-3 piezoelectric composite of the PMN65/PIN03-PT32(Cal) single crystal. Table 6 shows the results.

With the results, in a similar way to the comparison between the two types of the piezoelectric crystal devices, it was confirmed that the relative dielectric constant $\in_r$ and the piezoelectric constant ($d_h$) in the longitudinal vibration mode of the 1-3 piezoelectric composite produced from the PMN65/PIN03-PT32(Cal) single crystal were significantly improved compared with those of the 1-3 piezoelectric device produced from PZT. Thus, it was confirmed that a 1-3 piezoelectric composite can be produced at low cost by using the PMN65/PIN03-PT32(Cal) single crystal though it cannot be produced from the PMN68-PT32 single crystal at a reasonable cost due to a decrease in the yield. Furthermore, it was also confirmed that the piezoelectric characteristics such as the electromechanical coupling factor and the piezoelectric constant were significantly improved compared with those of a piezoelectric device produced from a sintered body of lead zirconate titanate (Pb(Zr, Ti)O$_3$: PZT) which is a mainly used piezoelectric device material at present.

The relative dielectric constant $\in_r$ was determined for the piezoelectric single-crystal device after the polarization by using an impedance analyzer (LF IMPEDANCE ANALYZER: a product of YHP Company, device number: YHP4192A). The piezoelectric constant ($d_h$) was calculated using a fixed equation ($d_h=d_{33}+2d_{31}$).

EXAMPLE 7

In EXAMPLES 1 to 6, the [Pb(Ca)(Mg$_{1/3}$Nb$_{2/3}$)O$_3$]$_{0.65}$[Pb(Ca)(In$_{1/2}$Nb$_{1/2}$)O$_3$]$_{0.03}$[Pb(Ca)TiO$_3$]$_{0.32}$ (PMN65/PIN03-PT32(Cal)) crystal was described. In this example, the appearance of a pyrochlore phase, a crystal yield, the presence of absence of heat cracking, and a wafer yield were also observed as in EXAMPLE 1 by changing the contents of calcium-substituted lead magnesium niobate (PMN(Ca)), calcium-substituted lead indium niobate (PIN(Ca)), calcium-substituted lead titanate (PT(Ca)), and calcium (Ca) or by using a crystal of calcium-substituted lead zinc niobate PZN (Ca) instead of calcium-substituted lead magnesium niobate (PMN(Ca)). Table 7 shows the results. It was confirmed in all cases that the crystal yield and the wafer yield were high and the productivity was high. Furthermore, it was confirmed that a piezoelectric device using these crystals had similar characteristics to those of a device of [PMN65/PIN03-PT32 (Cal)].

EXAMPLE 8

Devices were also produced, as in EXAMPLE 3, from compositions prepared by adding 0.5 mol % to 5 mol % of at least one element selected from the group consisting of Mn, Cr, Sb, W, Al, La, Li, and Ta to a solid solution of a [Pb(Ca)(Mg$_{1/3}$Nb$_{2/3}$)O$_3$]$_{0.65}$[Pb(Ca)(In$_{1/2}$Nb$_{1/2}$)O$_3$]$_{0.03}$[Pb(Ca)TiO$_3$]$_{0.32}$ (PMN65/PIN03-PT32(Cal)) crystal. The electromechanical coupling factor $k_{31}$ of the devices was also investigated under the test conditions which are the same as that in the device of PMN65/PIN03-PT32(Cal). As shown in Table 8, all devices had a high electromechanical coupling factor $k_{31}$ which was equivalent to that of PMN68-PT32 of the comparative example. In particular, the addition of Mn or Cr significantly improved the mechanical quality factor Qm from 65.0 to 120.0 to 150.0. The addition of Sb, W, La, or Ta substantially improved the relative dielectric constant $\in r$ from 3500 to 4300 to 4700. The mechanical quality factor Qm was calculated using a known equation (Electronic Materials Manufacturers Association of Japan Standard: EMAS-6008, 6100) by using an Impedance/Gain-Phase Analyzer (a product of HP Company, device number: HP4194A). The relative dielectric constant ∈r was obtained by using an impedance analyzer (a product of HP Company, device number: HP4192A) on the basis of Electronic Materials Manufacturers Association of Japan Standard (EMAS-6008, 6100).

EXAMPLE 9

A proper polarization process for producing a piezoelectric single-crystal device will now be described with reference to EXAMPLE 9. Table 9 shows the measurement results of the piezoelectric single-crystal devices using the electromechanical coupling factor $k_{31}$ in a lateral vibration mode which were prepared under various main polarization conditions in EXAMPLE 3. The producing process other than the main polarization and the size of the piezoelectric single-crystal devices and the test conditions were the same as those in EXAMPLE 3.

A PMN65/PIN03-PT32(Cal) device according to the present invention and a PMN68-PT32 device of a comparative example were produced as in EXAMPLE 3. The temperature for polarizing the piezoelectric single-crystal devices suitably used in a lateral vibration mode was 15 to 250° C., the electric field intensity was 700 V/mm which is in the range of the present invention, and polarization time was controlled according to the polarization temperature. The results are shown in Nos. 1 to 5 in Table 9. As shown by No. 1 in Table 9, when the polarization temperature was lower than 20° C., the electromechanical coupling factors $k_{31}$ in the direction (lateral vibration mode) orthogonal to the polarization direction of the PMN65/PIN03-PT32(Cal) device according to the present invention and the PMN68-PT32 device of the comparative example were 25% and 20%, respectively. This is insufficient as the characteristic of a device using lateral vibration mode. In addition, when the polarization temperature was 15° C. and the applied time was shorter than 180 min, the electromechanical coupling factor $k_{31}$ was further lower. This is thought that the polarization cannot be sufficiently performed at a polarization temperature lower than 20° C. On the other hand, when the polarization temperature exceeds 200° C. as shown by No. 5 in Table 9, the electromechanical coupling factors $k_{31}$ in the direction (lateral vibration mode) orthogonal to the polarization direction of the PMN65/PIN03-PT32(Cal) device according to the present invention and the PMN68-PT32 device of the comparative example were 32% and 30%, respectively. In addition, when the polarization temperature was 250° C. and the applied time exceeded 30 min, cracking occurred in many piezoelectric single-crystal devices during the application or right after the application of the electric field.

This is thought that over pole occurs under the above-mentioned conditions to deteriorate the piezoelectric characteristics of the piezoelectric single-crystal device. The occurrence of cracking in the piezoelectric single-crystal device is thought that breakage is caused by an increase in strain in the crystal due to the excessive electric field.

Piezoelectric single-crystal devices suitably used in a lateral vibration mode were produced as in EXAMPLE 3 by polarizing at a polarization temperature of 40° C., which is within the range of the present invention, by applying an electric field of 300 to 1600 V/mm. The polarization time was controlled according to the electric field intensity. The results are shown in Nos. 6 to 10 in Table 9. As shown by No. 6 in Table 9, when the applied electric field was lower than 350 V/mm, the electromechanical coupling factors $k_{31}$ in the direction (lateral vibration mode) orthogonal to the polarization direction of the PMN65/PIN03-PT32(Cal) device according to the present invention and the PMN68-PT32 device of the comparative example were 30% and 28%, respectively. This is insufficient as the characteristic of a device using lateral vibration mode. In addition, when the applied electric field was 300 V/mm and the applied time was shorter than 180 min, the electromechanical coupling factor $k_{31}$ was further lower in both the PMN65/PIN03-PT32(Cal) device according to the present invention and the PMN68-PT32 device of the comparative example. This is thought that the polarization cannot be sufficiently performed at an electric field lower than 350 V/mm. On the other hand, when the applied electric field exceeds 1500 V/mm as shown by No. 10 in Table 9, the electromechanical coupling factors $k_{31}$ in the direction (lateral vibration mode) orthogonal to the polarization direction of the PMN65/PIN03-PT32(Cal) device according to the present invention and the PMN68-PT32 device of the comparative example were 32% and 30%, respectively. In addition, when the applied electric field was 1600 V/mm and the applied time exceeded 30 min, cracking occurred in many piezoelectric single-crystal devices during the application or right after the application of the electric field.

This is thought that over pole occurs under the above-mentioned conditions to deteriorate the piezoelectric characteristics of the piezoelectric single-crystal device. The occurrence of cracking in the piezoelectric single-crystal device is thought that breakage is caused by an increase in strain in the crystal due to the excessive electric field.

Furthermore, crystals for the PMN65/PIN03-PT32(Cal) device according to the present invention and the PMN68-PT32 device of a comparative example suitably used in a lateral vibration mode were applied with a direct electric field of 300 to 1600 V/mm in silicon oil of 200° C. (in the range of the present invention) which is the Curie temperature Tc or more shown in FIG. 8. The polarization time was controlled according to the applied electric field. The results are shown in Nos. 11 to 15 in Table 9.

As shown by No. 11 in Table 9, when the applied electric field was lower than 350 V/mm, the electromechanical coupling factors $k_{31}$ in the direction (lateral vibration mode) orthogonal to the polarization direction of the PMN65/PIN03-PT32(Cal) device according to the present invention and the PMN68-PT32 device of the comparative example were 35% and 32%, respectively. This is insufficient as the characteristic of a device using lateral vibration mode. In addition, when the applied electric field was 300 V/mm and the applied time was shorter than 100 min, the electromechanical coupling factor $k_{31}$ was further lower in both the PMN65/PIN03-PT32(Cal) device according to the present invention and the PMN68-PT32 device of the comparative example. This is thought that the polarization cannot be sufficiently performed at an electric field lower than 350 V/mm. On the other hand, when the applied electric field exceeds 1500 V/mm as shown by No. 15 in Table 9, the electromechanical coupling factors $k_{31}$ in the direction (lateral vibration mode) orthogonal to the polarization direction of the PMN65/PIN03-PT32(Cal) device according to the present invention and the PMN68-PT32 device of the comparative example were 40% and 38%, respectively. In addition, when the applied electric field was 1600 V/mm and the applied time exceeded 30 min, cracking occurred in many piezoelectric single-crystal devices during the application or right after the application of the electric field.

As shown above, the electromechanical coupling factors $k_{31}$ in the direction (lateral vibration mode) orthogonal to the polarization direction of the PMN65/PIN03-PT32(Cal) device according to the present invention and the PMN68-

PT32 device of a comparative example were approximately the same as each other in the proper ranges of the polarization conditions.

It should be understood that the EXAMPLES described above are only exemplary embodiments of the present invention and that various modification can be made within the scope of claims.

INDUSTRIAL APPLICABILITY

According to the present invention, a piezoelectric single-crystal device which is equivalent to lead-based perovskite-structure single crystals which are free from additives such as lead indium niobate or Ca can be produced. The occurrence of a pyrochlore phase during the growth of the lead-based perovskite-structure single crystal which is free from additives such as lead indium niobate or Ca and decreases in the crystal yield and the wafer yield due to heat cracking during the cooling carried out after the growth of the single crystal are improved. Simultaneously, a decrease in the yield of single-crystal plates, which is caused by the occurrence of chipping during the cut-out of the single-crystal plates from the resulting wafer, is also improved. With this, it is possible to produce a piezoelectric single-crystal device which is sufficiently inexpensive compared with a piezoelectric single-crystal device produced from a lead-based perovskite-structure single-crystal not containing additives such as lead indium niobate or Ca. Consequently, the piezoelectric single-crystal device which can be broadly applied to fields where a conventional piezoelectric single-crystal device cannot be applied is provided.

TABLE 3

| | | PMN68-PT32 | PMN65/PIN03-PT32(Ca1) | Pb(Zr,Ti)O$_3$ |
|---|---|---|---|---|
| Piezoelectric Characteristics in Lateral Vibration Mode | Electro-mechanical Coupling Factor $k_{31}$ | 61 | 59 | 30 |
| | Piezoelectric Constant $d_{31}$ | −1200 | −1100 | −100 |

TABLE 4

| | | Electromechanical Coupling Factor $k_{31}$ (%) in Lateral Vibration Mode | | |
|---|---|---|---|---|
| Crystal Orientation | Angle (°) | PMN68-PT32 | PMN65/PIN03-PT32(Ca1) | Pb(Zr,Ti)O$_3$ |
| [100] | 0 | 61 | 59 | 30 |
| | 5 | 61 | 57 | |
| | 10 | 60 | 55 | |
| | 15 | 53 | 50 | |
| | 20 | 42 | 38 | |
| | 25 | 40 | 36 | |
| | 30 | 35 | 31 | |
| | 35 | 32 | 31 | |
| | 40 | 54 | 50 | |
| [110] | 45 | 59 | 58 | |
| | 50 | 53 | 51 | |
| | 55 | 32 | 30 | |
| | 60 | 35 | 31 | |
| | 65 | 37 | 31 | |
| | 70 | 34 | 32 | |
| | 75 | 54 | 50 | |

TABLE 1

| | PMN68-PT32 | | | PMN65/PIN03-PT32(Ca1) | | |
|---|---|---|---|---|---|---|
| Sample No. | Pyrochlore Phase Presence/ Appearance | Crystal Yield (%) | Heat Cracking Presence/ Appearance | Wafer Yield (%) | Pyrochlore Phase Presence/ Appearance | Crystal Yield (%) | Heat Cracking Presence/ Appearance | Wafer Yield (%) |
| 1 | Yes/Polycrystal | 0 | Yes/Few | 0 | No/— | 95 | Yes/Few | 83 |
| 2 | Yes/Crystal Surface | 75 | Yes/Whole | 38 | Yes/Crystal Surface | 86 | No/— | 85 |
| 3 | Yes/Upper Portion of Crystal | 58 | Yes/Bottom | 40 | No/— | 98 | No/— | 92 |
| 4 | No/— | 85 | Yes/Whole | 45 | No/— | 93 | Yes/Few | 86 |
| 5 | Yes/Polycrystal | 16 | Yes/Few | 5 | Yes/Crystal Surface | 83 | Yes/Few | 70 |
| Average Yield (%) | — | 46.8 | — | 25.6 | — | 91.0 | — | 83.2 |

TABLE 2

| Chipping | PMN68-PT32 | PMN65/PIN03-PT32(Ca1) |
|---|---|---|
| Occurred | 27 | 6 |
| Not Occurred | 23 | 44 |
| Occurrence Ratio (%) | 54 | 12 |
| Single-Crystal Plate Yield (%) | 46 | 88 |

TABLE 4-continued

| | | Electromechanical Coupling Factor $k_{31}$ (%) in Lateral Vibration Mode | | |
|---|---|---|---|---|
| Crystal Orientation | Angle (°) | PMN68-PT32 | PMN65/PIN03-PT32(Ca1) | Pb(Zr,Ti)O$_3$ |
| | 80 | 56 | 53 | |
| | 85 | 57 | 55 | |
| [010] | 90 | 60 | 59 | |

TABLE 5

|  |  | PMN68-PT32 | PMN65/PIN03-PT32(Ca1) | Pb(Zr,Ti)O$_3$ |
|---|---|---|---|---|
| Piezoelectric Characteristics in Longitudinal Vibration Mode | Electro-mechanical Coupling Factor k$_{33}$ | 92 | 86 | 59 |
|  | Piezoelectric Constant d$_{33}$ | 2000 | 1600 | 220 |

TABLE 6

|  |  | 1-3 Piezoelectric Composite | | |
|---|---|---|---|---|
|  |  | PMN68-PT32 | PMN65/PIN03-PT32(Ca1) | Pb(Zr,Ti)O$_3$ |
| Piezoelectric Characteristics in Longitudinal Vibration Mode | Relative Dielectric Constant $\epsilon r$ | — | 2500 | 1800 |
|  | Piezoelectric Constant d$_h$ | — | 120 | 40 |

TABLE 7

| Sample No. | PMN/PIN-PT(Ca) PMN(Ca) mol % | PIN(Ca) mol % | PT(Ca) mol % | Ca mol % | Pyrochlore Phase Presence/Appearance | Crystal Yield % | Heat Cracking Presence/Appearance | Wafer Yield % |
|---|---|---|---|---|---|---|---|---|
| 6 | 35.0 | 35.0 | 0.1 | 64.9 | 0.05 | No | 95 | No | 95 |
| 7 | 97.9 | 0.05 | 2.05 | 0.05 | Yes/Crystal Surface | 85 | Yes/Few | 80 |
| 8 | 69.9 | 30.0 | 0.1 | 10.0 | Yes/Crystal Surface | 83 | No | 89 |
| 9 | 35.0 | 30.0 | 35.0 | 10.0 | No | 94 | Yes/Few | 85 |
|  | PZN/PIN-PT(Ca) PZN(Ca) mol % |  |  |  |  |  |  |  |
| 10 | 98.0 | 0.1 | 1.9 | 10.0 | No | 93 | No | 90 |
| 11 | 70.0 | 0.1 | 29.9 | 0.05 | Yes/Crystal Surface | 85 | Yes/Few | 80 |
| 12 | 69.9 | 30.0 | 0.1 | 10.0 | Yes/Crystal Surface | 83 | No | 89 |

Note: Row 6 has an extra value - sample 6 data: PMN(Ca) 35.0, PIN(Ca) 0.1, PT(Ca) 64.9, Ca 0.05.

TABLE 8

| Piezoelectric Crystal Device in EXAMPLE 3 | Additional Element | k$_{31}$ | Mechanical Quality Factor Qm | Relative Dielectric Constant $\epsilon$r | Note |
|---|---|---|---|---|---|
| PMN65/PIN03-PT32(Ca1) | Additional Element: 0 mol % | 59.0% | 65.0 | 3500 | Present Invention |
|  | Mn: 0.5 mol ppm | 53.5% | 120.0 | 3200 | Present Invention |
|  | Mn: 5 mol % | 51.5% | 150.0 | 3100 | Present Invention |
|  | Cr: 2 mol % | 48.3% | 120.0 | 3210 | Present Invention |
|  | Sb: 2 mol % | 50.1% | 75.0 | 4500 | Present Invention |
|  | W: 2 mol % | 49.8% | 68.4 | 4300 | Present Invention |
|  | Al: 2 mol % | 49.3% | 69.1 | 3800 | Present Invention |
|  | La: 2 mol % | 45.0% | 67.0 | 4600 | Present Invention |
|  | Li: 2 mol % | 50.2% | 66.0 | 3700 | Present Invention |
|  | Ta: 2 mol % | 50.6% | 67.4 | 4700 | Present Invention |
|  | Mn + Cr: 2 mol % | 50.2% | 170.0 | 3200 | Present Invention |

TABLE 9

| | Polarization Condition | | | k$_{31}$(%) | | |
|---|---|---|---|---|---|---|
| No. | Temperature ° C. | Electric Field V/mm | Time min | PMN68-PT32 | PMN65/PIN03-PT32(Ca1) | Note |
| 1 | 15 | 700 | 180 | 25 | 20 | Temperature Range COMPARATIVE EXAMPLE |
| 2 | 20 | 700 | 100 | 60 | 58 | EXAMPLE |
| 3 | 40 | 700 | 60 | 61 | 59 | EXAMPLE |
| 4 | 200 | 700 | 30 | 61 | 58 | EXAMPLE |

TABLE 9-continued

| | Polarization Condition | | | $k_{31}$(%) | | | |
|---|---|---|---|---|---|---|---|
| No. | Temperature °C. | Electric Field V/mm | Time min | PMN68-PT32 | PMN65/PIN03-PT32(Ca1) | | Note |
| 5 | 250 | 700 | 30 | 32 | 30 | | COMPARATIVE EXAMPLE |
| 6 | 40 | 300 | 180 | 30 | 28 | Electric Field Intensity Range | COMPARATIVE EXAMPLE |
| 7 | 40 | 350 | 100 | 60 | 59 | | EXAMPLE |
| 8 | 40 | 700 | 60 | 61 | 59 | | EXAMPLE |
| 9 | 40 | 1500 | 30 | 61 | 60 | | EXAMPLE |
| 10 | 40 | 1600 | 30 | 32 | 30 | | COMPARATIVE EXAMPLE |
| 11 | 200 → 25 Electric Field Cooling | 300 | 100 | 35 | 32 | Electric Field Intensity Range | COMPARATIVE EXAMPLE |
| 12 | 200 → 25 Electric Field Cooling | 350 | 100 | 62 | 59 | | EXAMPLE |
| 13 | 200 → 25 Electric Field Cooling | 700 | 60 | 60 | 57 | | EXAMPLE |
| 14 | 200 → 25 Electric Field Cooling | 1500 | 30 | 61 | 59 | | EXAMPLE |
| 15 | 200 → 25 Electric Field Cooling | 1600 | 30 | 40 | 38 | | COMPARATIVE EXAMPLE |

The invention claimed is:

1. A piezoelectric single crystal having a complex perovskite structure, wherein the composition of the piezoelectric single crystal contains 35 to 98 mol % lead magnesium niobate [Pb(Mg⅓Nb⅔)O3] or lead zinc niobate [Pb(Zn⅓Nb⅔)O3], 0.1 to 64.9 mol % lead titanate [PbTiO3], and 0.05 to 30 mol % lead indium niobate [Pb(In½Nb½)O3]; and calcium is substituted for 0.05 to 10 mol % lead in the composition.

2. A piezoelectric single-crystal device having the polarization direction in a [001] direction of an ingot of the piezoelectric single crystal according to claim 1 and using an electromechanical coupling factor (k31) in a lateral vibration mode having the end face in a plane perpendicularly cutting a (001) plane containing a [100] direction and a [010] direction being approximately orthogonal to the polarization direction, wherein when the [100] direction or the [010] direction is defined as 0°, a direction normal to the end face resides within 0°±15° or within 45°±5°.

3. A piezoelectric single-crystal device having the polarization direction in a [001] direction of an ingot of the piezoelectric single crystal according to claim 1 and using an electromechanical coupling factor (k31) in a lateral vibration mode having a direction normal to the end face of the single-crystal device in a [100] direction, a [010] direction, or a [110] direction being approximately orthogonal to the polarization direction, wherein the direction normal to the end face of the single crystal resides in a solid angle of the [100] axis±15°, in a solid angle of the [010] axis±15°, or in a solid angle of the [110] axis±5°.

4. A piezoelectric single-crystal device having the polarization direction in a [001] direction of an ingot of the piezoelectric single crystal according to claim 1 and using an electromechanical coupling factor (k33) in a vibration mode in the direction parallel to the polarization direction, i.e., in a longitudinal vibration mode having the end face in a (001) plane, wherein when the shortest-side length or the diameter of the device end face orthogonal to the polarization direction is defined as a and the device length in the direction parallel to the polarization direction is defined as b, the piezoelectric single-crystal device has the a and the b satisfying the relational formula b/a³ 2.5.

5. A piezoelectric single-crystal device having the polarization direction in a [110] direction of an ingot of the piezoelectric single crystal according to claim 1 and using an electromechanical coupling factor (k33) in a vibration mode in the direction parallel to the polarization direction, i.e., in a longitudinal vibration mode having the end face in a (110) plane, wherein when the shortest-side length or the diameter of the device end face orthogonal to the polarization direction is defined as a and the device length in the direction parallel to the polarization direction is defined as b, the piezoelectric single-crystal device has the a and the b satisfying the relational formula b/a³ 2.5.

6. A 1-3 piezoelectric composite formed by arraying a plurality of the piezoelectric single-crystal devices according to claim 4 in such a manner that the device end faces orthogonal to the polarization direction reside in one plane.

7. A 1-3 piezoelectric composite formed by arraying a plurality of the piezoelectric single-crystal devices according to claim 5 in such a manner that the device end faces orthogonal to the polarization direction reside in one plane.

8. A method for manufacturing the piezoelectric single-crystal device according to claim 2, the method comprising a polarizing process carried out before or after the cutting of an ingot of a piezoelectric single crystal having a complex perovskite structure wherein the composition of the piezoelectric single crystal contains 35 to 98 mol % lead magnesium niobate [Pb(Mg⅓Nb⅔)O3] or lead zinc niobate [Pb(Zn⅓Nb⅔)O3], 0.1 to 64.9 mol % lead titanate [PbTiO3], and 0.05 to 30 mol % lead indium niobate [Pb(In½Nb½)O3]; calcium is substituted for 0.05 to 10 mol % lead in the composition; and the composition further contains 5 mol % or less in total of at least one element selected from the group consisting of Mn, Cr, Sb, W, Al, La, Li, and Ta, into a single-crystal device material having a predetermined shape in a predetermined direction, wherein the single-crystal ingot or the single-crystal device material is polarized by applying a direct electric field of 350 to 1500 V/mm in the temperature range of 20 to 200° C. in a direction to be polarized of the single-crystal ingot or in a direction to be polarized of the cut-out single-crystal device material; or applying a direct electric field of 350 to 1500 V/mm at a temperature higher than the Curie temperature (Tc) of the single-crystal ingot or the single-crystal device material and then cooling to a room temperature while applying the direct electric field.

9. A method for manufacturing the piezoelectric single-crystal device according to claim 2, the method comprising a polarizing process carried out before or after the cutting of an ingot of a piezoelectric single crystal having a complex perovskite structure wherein the composition of the piezoelectric single crystal contains 35 to 98 mol % lead magnesium niobate [$Pb(Mg_{1/3}Nb_{2/3})O_3$] or lead zinc niobate [$Pb(Zn_{1/3}Nb_{2/3})O_3$], 0.1 to 64.9 mol % lead titanate [$PbTiO_3$], and 0.05 to 30 mol % lead indium niobate [$Pb(In_{1/2}Nb_{1/2})O_3$]; and calcium is substituted for 0.05 to 10 mol % lead in the composition, into a single-crystal device material having a predetermined shape in a predetermined direction, wherein the single-crystal ingot or the single-crystal device material is polarized by applying a direct electric field of 350 to 1500 V/mm in the temperature range of 20 to 200° C. in a direction to be polarized of the single-crystal ingot or in a direction to be polarized of the cut-out single-crystal device material; or applying a direct electric field of 350 to 1500 V/mm at a temperature higher than the Curie temperature (Tc) of the single-crystal ingot or the single-crystal device material and then cooling to a room temperature while applying the direct electric field.

* * * * *